United States Patent
Lee

(10) Patent No.: US 6,205,081 B1
(45) Date of Patent: Mar. 20, 2001

(54) ADDRESS GENERATING CIRCUIT OF SEMICONDUCTOR MEMORY DEVICE

(75) Inventor: Young-Dae Lee, Seoul (KR)

(73) Assignee: Sumsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/457,906

(22) Filed: Dec. 8, 1999

(30) Foreign Application Priority Data

Dec. 9, 1998 (KR) .................................................. 98-53886

(51) Int. Cl.$^7$ ..................................................... G11C 8/00

(52) U.S. Cl. ............................... 365/230.08; 365/230.02; 365/240

(58) Field of Search .................... 365/230.02, 230.08, 365/236, 240, 194, 189.02

(56) References Cited

U.S. PATENT DOCUMENTS 5,761,150 * 6/1998 Yukutake et al. .................... 365/233
5,815,459 * 9/1998 Park et al. ....................... 365/230.06

* cited by examiner

*Primary Examiner*—David Nelms
*Assistant Examiner*—Gene N. Auduong
(74) *Attorney, Agent, or Firm*—Marger Johnson & McCollom, P.C.

(57) ABSTRACT

An address generating circuit of a semiconductor memory device includes address buffers, multiplexers, shift registers and latches by which high-bit and low-bit write/read addresses in a normal mode and in a burst mode are routed through separate paths. A control circuit routes the high-bit read address data through a different path than the high bit write address data. The paths are joined to a common output latch, and include differential delays for the data. Similarly, the low-bit read continuing burst address data is routed through a different path than the low bit continuing burst write address data.

30 Claims, 15 Drawing Sheets

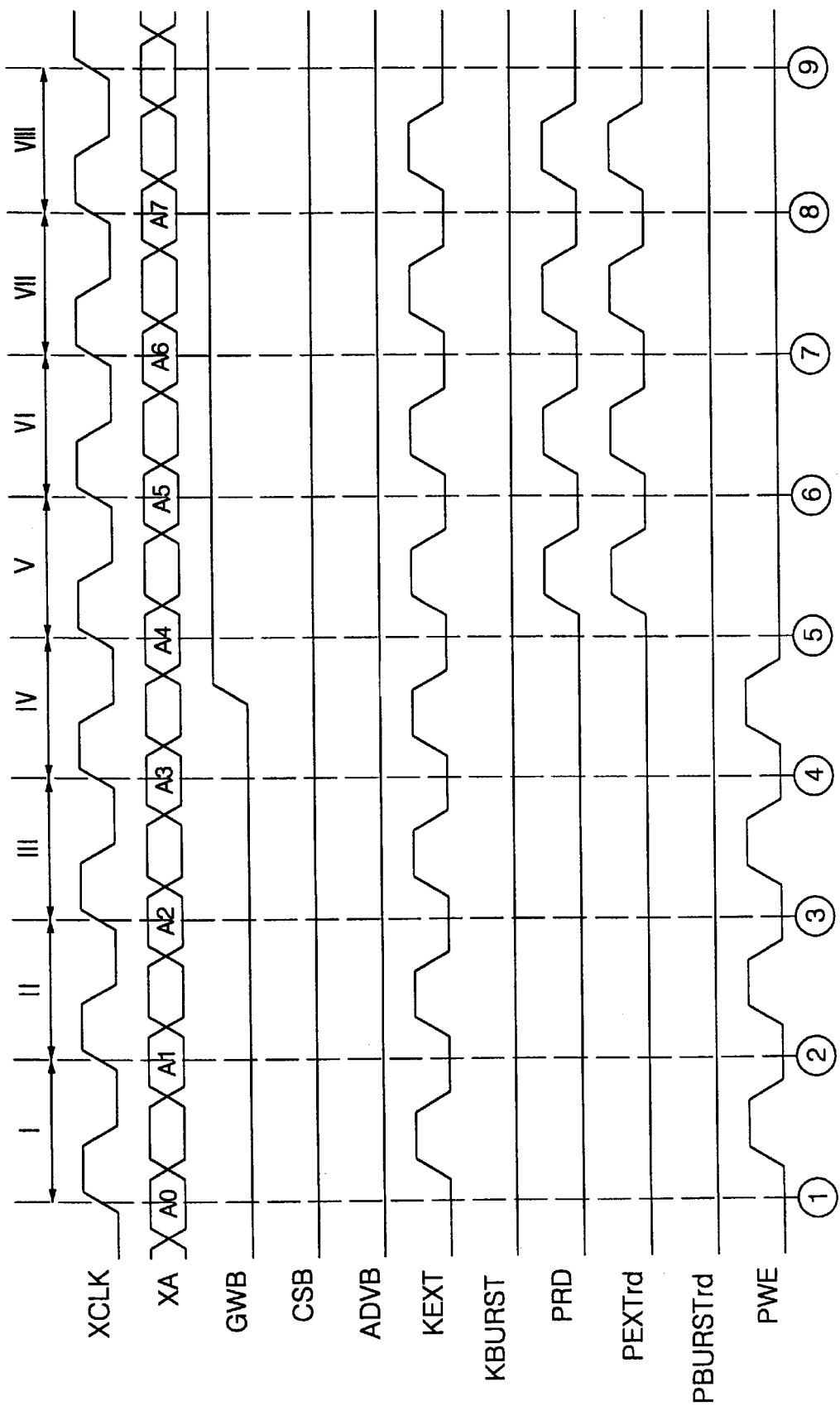

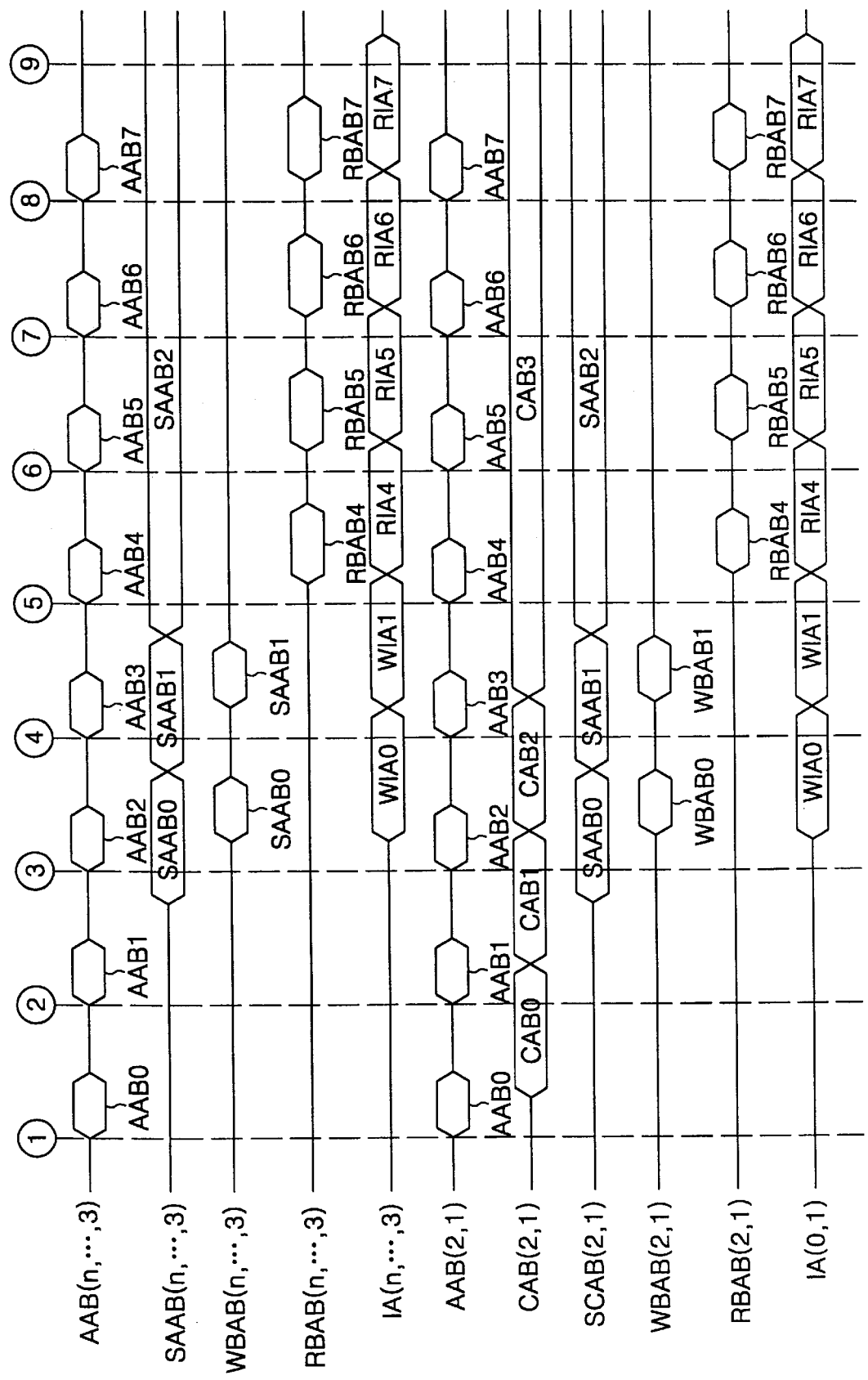

ADDRESS GENERATING CIRCUIT OF SEMICONDUCTOR MEMORY DEVICE

BACKGROUND OF THE INVENTION

1. Field of the Invention

The present invention relates to a semiconductor memory device, and more particularly to an address generating circuit of a semiconductor memory device which generates read and write addresses when the semiconductor device having read and write functions after different cycle is operated in each of normal and burst modes.

2. Description of the Prior Art

Semiconductor memory devices can be classified according to their address generating methods into normal mode and burst mode, and the burst mode is classified into linear burst mode and interleave burst mode.

In the normal mode, an address input externally is generated as an internal address when a read or write command is performed. In the burst mode, a burst starting address is input externally, and thereafter a burst continuing address is generated. In the linear burst mode, the burst continuing address increases from the burst starting address. In the interleave burst mode, the burst continuing address increases from the burst starting address if the burst starting address is an even number, and decreases from the burst starting address if the burst starting address is an odd number.

As described in the above, the conventional semiconductor memory performing the normal and burst modes and the burst counter for performing such modes are already well known.

FIG. 1 is a block diagram showing an address generating circuit of a conventional semiconductor memory device. The circuit comprises address buffers 10 and 18, a clock buffer 26, multiplexers 12, 14, 20, 22, 30, counter 28, latches 16, 24, and a control circuit 32.

The operations of these blocks are now described. An external address XA is considered divided into a high left portion with n-j bits, and a low level portion, with j bits. Usually j=2.

The address buffer 10 buffers the other bit XA(n, . . . , 3) except a low 2 bit among n bit addresses XAB(n, . . . , 1), and generates the buffered addresses AB(n, . . . , 3). The address buffer 18 buffers a low 2 bit XA(2, 1), and generates the buffered address AB (2, 1). The clock buffer 26 buffers the clock signal XCLK inputted externally, and generates the buffered clock signal KIN. The multiplexers 12, 20 allow the buffered addresses AB(n, . . . , 3), AB(2,1) to be transmitted as their output signals AAB(n, . . . , 3), AAB(2,1), in response to the buffered clock signal KIN.

The control circuit 32 receives an inversion chip selective signal CSB, a read/write control signal GWB, a normal/burst mode control signal ADVB, and the buffered clock signal KIN to generate an external input control signal KEXT, an external input selective signal PEXT, a burst continuing control signal KBURST, and a burst input selective signal PBURST. A chip is enabled when the inversion chip selective signal CSB is at a low level, a write command is performed when the read/write control signal GWB is at a low level, a read command is performed when the read/write control signal GWB is at a high level, and a burst address of burst mode is generated when the normal/burst mode control signal ADVB is at a high level. The control signal KEXT is generated prior to selective signal PEXT, to generate the burst starting address. The burst continuing control signal KBURST is generated a predetermined time before the burst input selective signal PBURST is generated, to generate the burst continuing address.

The counter 28 receives and outputs the output signal AA(2, 1) in response to the control signal KEXT when it is at a normal mode, and receives and outputs the burst starting address outputted from the multiplexer 20 in response to control signal KEXT when it is at a burst mode, and performs counting at the burst starting address in response to the burst continuing control signal KBURST to generate the burst continuing address as an output signal CAB(2,1).

The multiplexers 14, 22 generate the output signals AAB (n, . . . , 3) and AAB(2,1) of the multiplexers 12, 20 in response to the external input selective signal PEXT, respectively. The multiplexer 30 elects and outputs the output signal CAB(2, 1) of the counter 28 in response to the burst input selective signal PBURST. The latch 16 latches and outputs the output signal of the multiplexer 14. The latch 24 latches and outputs the output signal of the multiplexer 22, or multiplexer 30. The latched addresses are outputted to a decoder and decoded by it.

The counter 28 shown in FIG. 1 generates the burst continuing address in accordance with the processes as stated in the above, in case of a linear burst mode and in case of an interleave burst mode, respectively.

In FIG. 1, the route or data path consisting of address buffer 10, multiplexers 12 and 14, latches 16 and the route consisting of address buffer 18, multiplexers 20, 22, latch 24 are for generating read and write addresses in a normal mode. The route consisting of address buffer 18, multiplexer 20, counter 28, multiplexer 30, latch 24 is for generating read and write addresses in a burst mode.

FIG. 2 is an operational timing diagram illustrating a burst mode operation in an address generating circuit of the conventional semiconductor memory device. FIG. 2 shows read and write operations after 0 cycle. The operation will be explained as follows.

The first cycle I to the fourth cycle IV is for illustrating the generation of the burst write address. In the first cycle I, the control circuit 32 serves to generate the external input control signal KEXT of high level, the burst continuing control signal KBURST of low level, the external input selective signal PEXT, and the burst input selective signal PBURST in response to the inversion chip selective signal CSB of low level, read/write control signal GWB, and the normal/burst mode control signal ADVB of high level, respectively. The selective signal PEXT and the burst input selective signal PBURST are pulse signals resulting from the delay of the external input control signal KEXT and the burst continuing control signal KBURST, respectively.

The multiplexers 12, 20 select and output the buffered addresses AB(n,*,3), AB(2,1) outputted from the address buffers 10, 18, in response to the buffered clock signal KIN. The counter 28 receives the burst starting write address outputted from the multiplexer 20 in response to the external input control signal KEXT, to output the output address CAB(2, 1). The multiplexer 14 selects and outputs the address AAB(n, . . . , 3) outputted from the multiplexer 12 in response to the external input selective signal PEXT. The multiplexer 30 selects and outputs the address CAB(2,1) outputted from the counter 28 in response to the burst input selective signal PBURST. The latches 16, 24 serves to latch the address outputted from the multiplexers 14, 30 to thereafter generate the burst starting write address.

The second cycle II to the fourth cycle IV respectively performs the repeated operation. The control circuit 32 receives the normal/burst mode control signal ADVB of "high" level to generate the external input control signal KEXT of low level and the burst continuing control signal KBURST of "high" level irrespective of the read/write control signal GWB and the inversion chip selective signal CSB. The counter 28 counts the output signal of the multiplexer 20 in response to the burst continuing control signal KBURST in response to the burst continuing control signal KBURST to thereby generate the counted output signal CAB(2,1). The multiplexer 30 selects and generate the counted output signal CAB(2,1) in response to the burst input selective signal PBURST. The latch 24 latches and outputs the output signal of the multiplexer 30. The latch 16 outputs the address latched in the prior cycle. That is, the burst continuing write address counted from the burst starting address is generated in the second cycle to the fourth cycle.

The fifth cycle V to the eighth cycle VIII show illustrating the generation of the burst read address.

In the fifth cycle V, the control circuit 32 receives the inversion chip selective signal CSB and read/write control signal GWB of "low" level and the normal/burst mode control signal of "high" level to generate the external input control signal KEXT and selective signal PEXT of "high" levels, and the burst continuing control signal KBURST and burst input selective signal PBURST of "low" levels. The address buffers 10, 18 perform buffering the burst starting addresses XA(n, *, 3), XA(2,1) to generate the buffered addresses AB(n, *, 3), AB(2,1), respectively. The multiplexers 12, 20 output the buffered addresses AB(n, . . . , 3), AB(2, 1) in response to the buffered clock signal KIN, respectively.

The counter 28 outputs the burst starting read address inputted from the external in response to the external input control signal KEXT. The multiplexer 30 selects and outputs the burst starting read address outputted from the counter 28 in response to the burst input selective signal PBURST. The latch 24 latches the burst starting read address outputted from the multiplexer 30 to generate the address IA(2, 1).

The sixth cycle VI to eighth VIII perform the repeated operations. The control circuit 32 serves to generate the external input control signal KEXT and selective signal PEXT of "low" levels and the burst continuing control signal KBURST and burst input selective signal PBURST of "high" levels in response to the normal/burst mode control signal ADVB of "high" level, irrespective of the inversion chip selective signal CSB and the read/write control signal GWB. The counter 28 counts from the burst starting address and generates the burst continuing read address in response to the external input control signal KEXT. The multiplexer 30 generates the counted output signal CAB(2, 1) in response to the burst input selective signal PBURST. The latch 24 latches and outputs the output signal of the multiplexer 30. The multiplexer 14 selects and outputs the output signal AAB(n, . . . , 1) of the multiplexer 12 in response to the external input selective signal PEXT. The latch 16 latches and outputs the output signal of the multiplexer 14. That is, the sixth cycle to the eighth cycle performs counting the burst starting read address and generating the burst continuing read address.

FIG. 3 is an operational timing diagram for illustrating the method of generating the address in a normal mode, in case that the same control signal as the control signals shown in FIG. 2 is inputted from the external.

In a normal mode, the read/write control signal GWB is at a "low" level during the first cycle to the fourth cycle, and at a "high" level during fifth cycle to the eighth cycle. And the normal/burst mode control signal ADVB is fixed at a "low" level. Then the external input control signal PEXT and selective signal KEXT is generated whenever the external address is input, and the burst continuing control signal KBURST and burst input selective signal PBURST is fixed at a "low" level.

Accordingly, a normal mode allows selecting and outputting read and write addresses of a high n–2 bit inputted via the address buffer 10 and the multiplexer 12 in response to the external input selective signal PEXT. The latch 16 is allowed to latch and output the address outputted from the multiplexer 14. And the normal mode allows selecting and outputting read and write addresses inputted via the address buffer 18, and the multiplexer 20, and the latch 24 latches the address outputted from the multiplexer 22.

In a normal mode, the control circuit 32 serves to generate the external input control signal KEXT and the selective signal PEXT every cycle. The counter 28 receives and outputs the output signal AAB(2, 1) of the multiplexer 20 in response to the external input control signal KEXT. However, as the burst continuing control signal KBURST is not generated, the output signal CAB(2,1) of the counter 28 is not output. And then, the multiplexer 22 is enabled by the selective signal PEXT to output the output signal AAB(2, 1) of the multiplexer 20. The latch 24 latches and outputs the output signal of the multiplexer 22. Accordingly, the read, write address XA(n, *, 3) is output by the address buffer 10, multiplexers 12, 14 and latch 16, and the read, write address XA(2, 1) is output by the address buffer 18, multiplexers 20, 22 and the latch 24.

The inventor has identified the following shortcoming of the prior art of FIG. 1. The conventional address generating circuit corresponds to an address generating circuit being operated in the normal mode and burst mode after 0 cycle. The circuit can not be applied as an address generating circuit of a semiconductor memory device performing a normal mode and a burst mode after n cycle. That is, if read and write addresses are different in the generating cycles therebetween, there has been a problem that the conventional address generating circuit could not be applied to a semiconductor memory device. The inventor has determined that this is because the conventional address generating circuit was designed for the addresses to be generated through the same routes for both the read and the write addresses, and for both the normal and burst modes.

SUMMARY OF THE INVENTION

Accordingly, the present invention is provided to solve the aforementioned problem and it is an object of the present invention to provide an address generating circuit of a semiconductor memory device which can generate an address in normal and burst modes after different cycle.

The invention provides an address generating circuit of a semiconductor memory device by which high-bit and low-bit write/read addresses in a normal mode and in a burst mode are routed through separate paths. A control circuit routes the high-bit read address data through a different path than the high bit write address data. The paths are joined to a common output latch, and include differential delays for the data. Similarly, the low-bit read continuing burst address data is routed through a different path than the low bit continuing burst write address data.

In accordance with the object of the present invention, an address generating circuit for generating a read address after 0 cycle and a write address after a predetermined cycle in a semiconductor device comprises a high bit read address generating means for generating a read address of a high level bit; a high bit write address generating means for generating a write address of a high level bit delayed by a predetermined cycle; a low bit read address generating means for generating read addresses in normal and burst modes of low level bit; a low bit write address generating means for generating write addresses in normal and burst modes of low level bit delayed by a predetermined cycle; and a controlling means for controlling the generation of the addresses of the address generating means.

And, an address generating circuit for generating a write address after 0 cycle and a read address after a predetermined cycle in a semiconductor device, comprises a high bit read address generating means for generating a read address of a high level bit delayed by a predetermined cycle; a high bit write address generating means for generating a write address of a high level bit; a low bit read address generating means for generating read addresses in normal and burst modes of low level bit delayed by a predetermined cycle; a low bit write address generating means for generating write addresses in normal and burst modes of low level bit; and a controlling means for controlling the generation of the addresses of the address generating means.

And, an address generating circuit for generating a write address after a predetermined cycle and a read address after a predetermined cycle in a semiconductor device, comprises a high bit read address generating means for generating a read address of a high level bit delayed by a predetermined cycle; a high bit write address generating means for generating a write address of a high level bit delayed by a predetermined cycle; a low bit read address generating means for generating read addresses in normal and burst modes of low level bit delayed by a predetermined cycle; a low bit write address generating means for generating write addresses in normal and burst modes of low level bit delayed by a predetermined cycle; and a controlling means for controlling the generation of the addresses of the address generating means.

BRIEF DESCRIPTION OF THE DRAWINGS

For filler understanding of the nature and object of the invention, reference should be made to the following detailed description taken in conjunction with the accompanying drawings in which:

FIG. 8 is a timing diagram for illustrating an operation of the address generating circuit of FIG. 4 in a normal mode;

DETAILED DESCRIPTION OF THE PREFERRED EMBODIMENT

Figure 1:
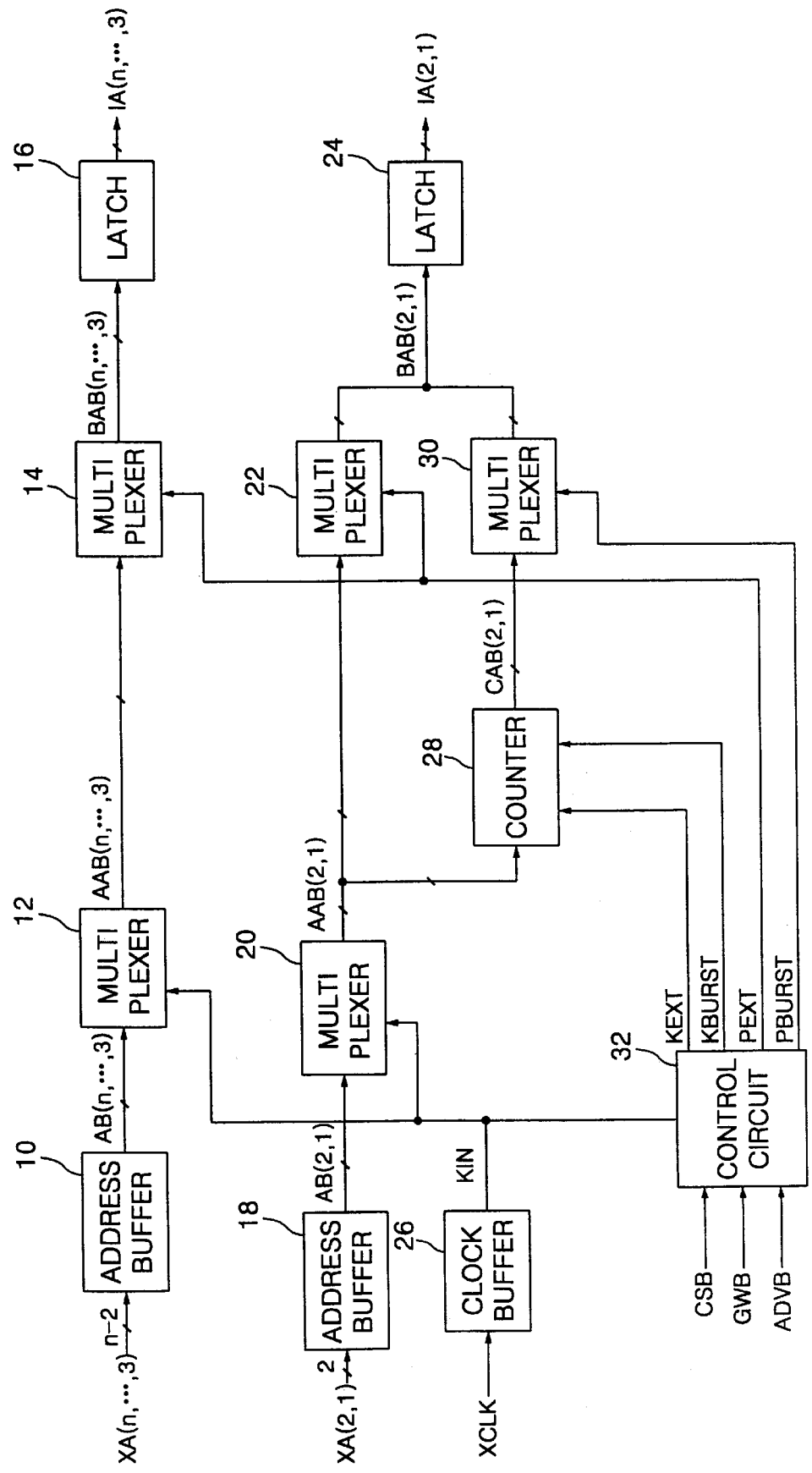
FIG. 1 is a block diagram illustrating an address generating circuit in a conventional semiconductor memory device.
Figure 2:
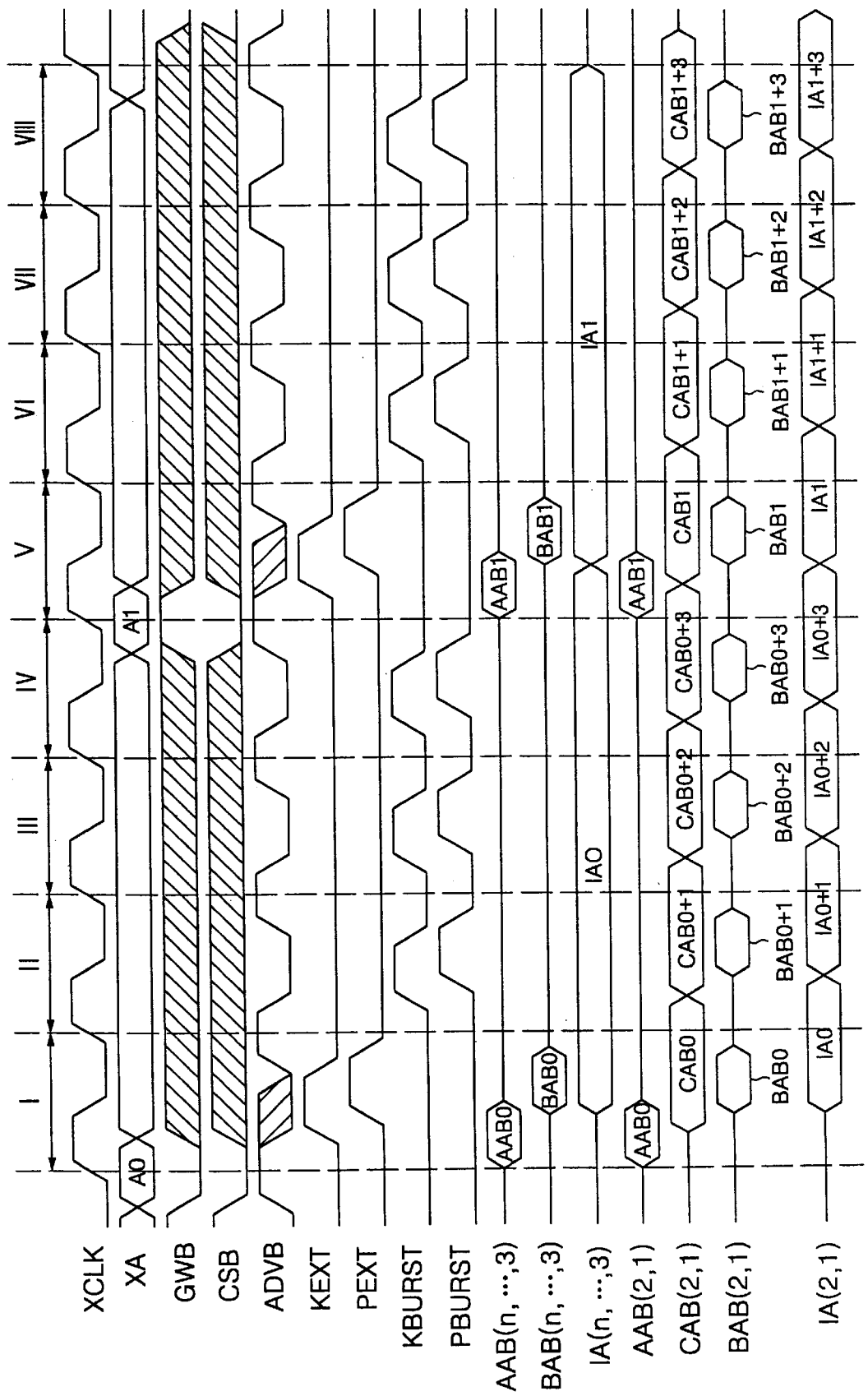
FIG. 2 is a timing diagram illustrating an operation of an address generating circuit of FIG. 1, operating in a burst mode.
Figure 3:
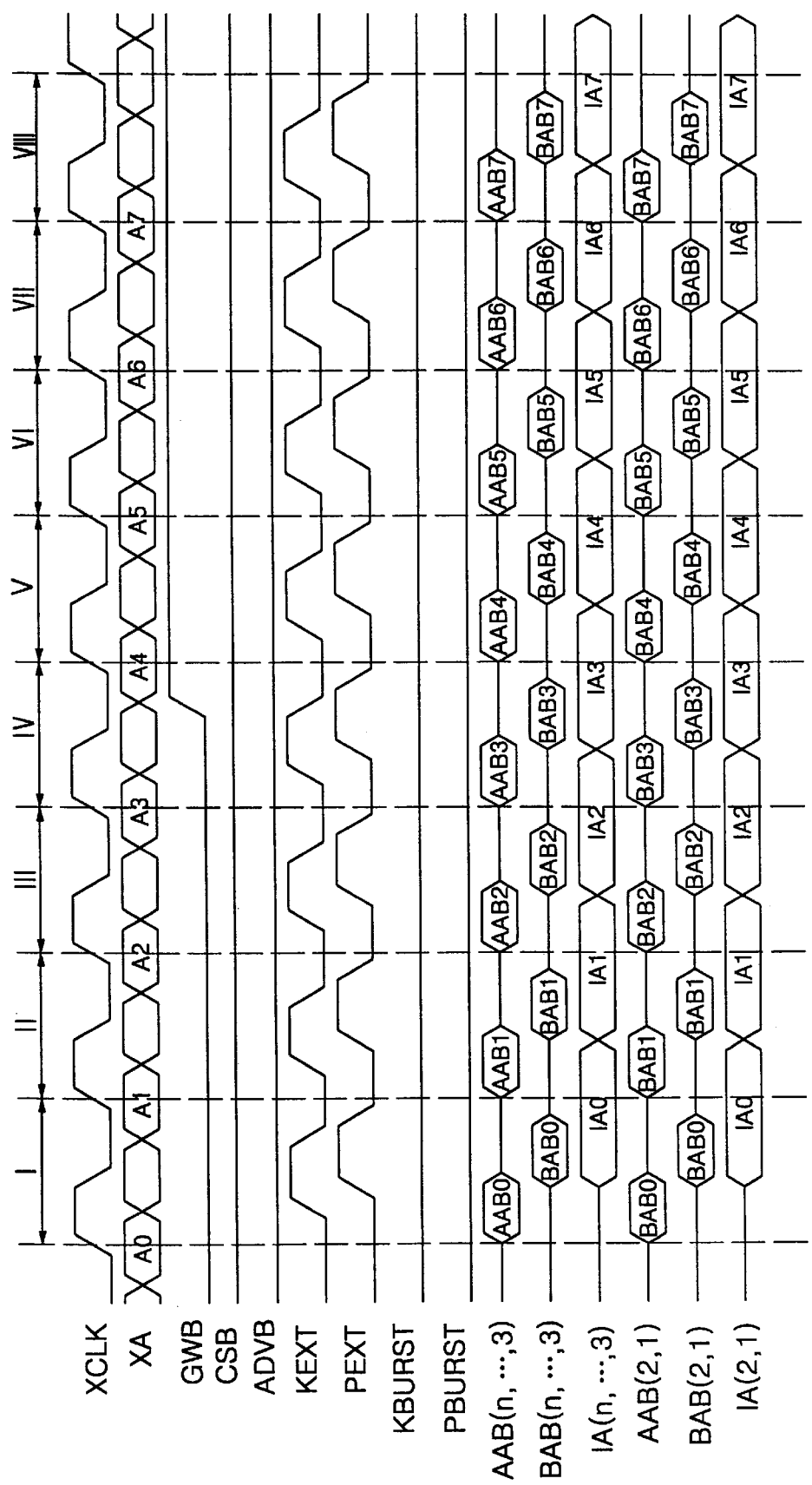
FIG. 3 is a timing diagram illustrating an operation of an address generating circuit of FIG. 1, operating in a normal mode.

The preferred embodiments of the address generating circuit of the present invention will now be described in detail with reference to the accompanying drawings.

Throughout the drawings, like reference numerals and nomenclature are used for designation of like or equivalent parts or portion, and as such their detailed description is omitted for simplicity of illustration and explanation.

The invention operates by providing distinct paths for routing at least portions of the read and write addresses. Further, one is differentially delayed relative to the other, such as by placing a shift register in one of the paths. The delays are by predetermined cycles that can be equal to each other, or different from each other.

In particular, the high n-j bit portion of a read address is routed through a different address than the high n-j portion of a write address. And the read and write portions produced by the j-bit portion in burst mode, are routed through different paths.

More specifically, the preferred embodiment of the invention is a circuit that includes two sections, one for the high level bits, and one for the low level bits. Each section includes a multiplexer for generating bits in response to the external address, which is either a read address or a write address. Data paths transfer bits generated by the multiplexers to a latch for each section.

The section for the high level bits includes two data paths that are also known as a read address high data path and a write address high data path. These are distinct at least in part. A control circuit routes those high level bits that correspond to a read address through the read address high data path, and for routing those high level bits that correspond to a write address through the write address high data path. The circuitry associated with the read address high data path is also known as high bit read address generating means, and the circuitry associated with the write address high data path is also known as high bit read address generating means.

The section for the low level bits includes three low data paths that are distinct at least in part. The first low data path is used for one of the normal modes. A counter is in at least the second and third low data paths for burst mode operation. The control circuit routes those low level burst bits that correspond to a read address through the second low data path, and those low level burst bits that correspond to a write address through the third low data path. The section for the low level bits includes a low bit read address generating means and a high bit read address generating means.

Three illustrative embodiments of the invention are now described with reference to FIGS. 4, 9 and 10. They have different features and different advantages. Other combinations of their features are possible.

Figure 4A:
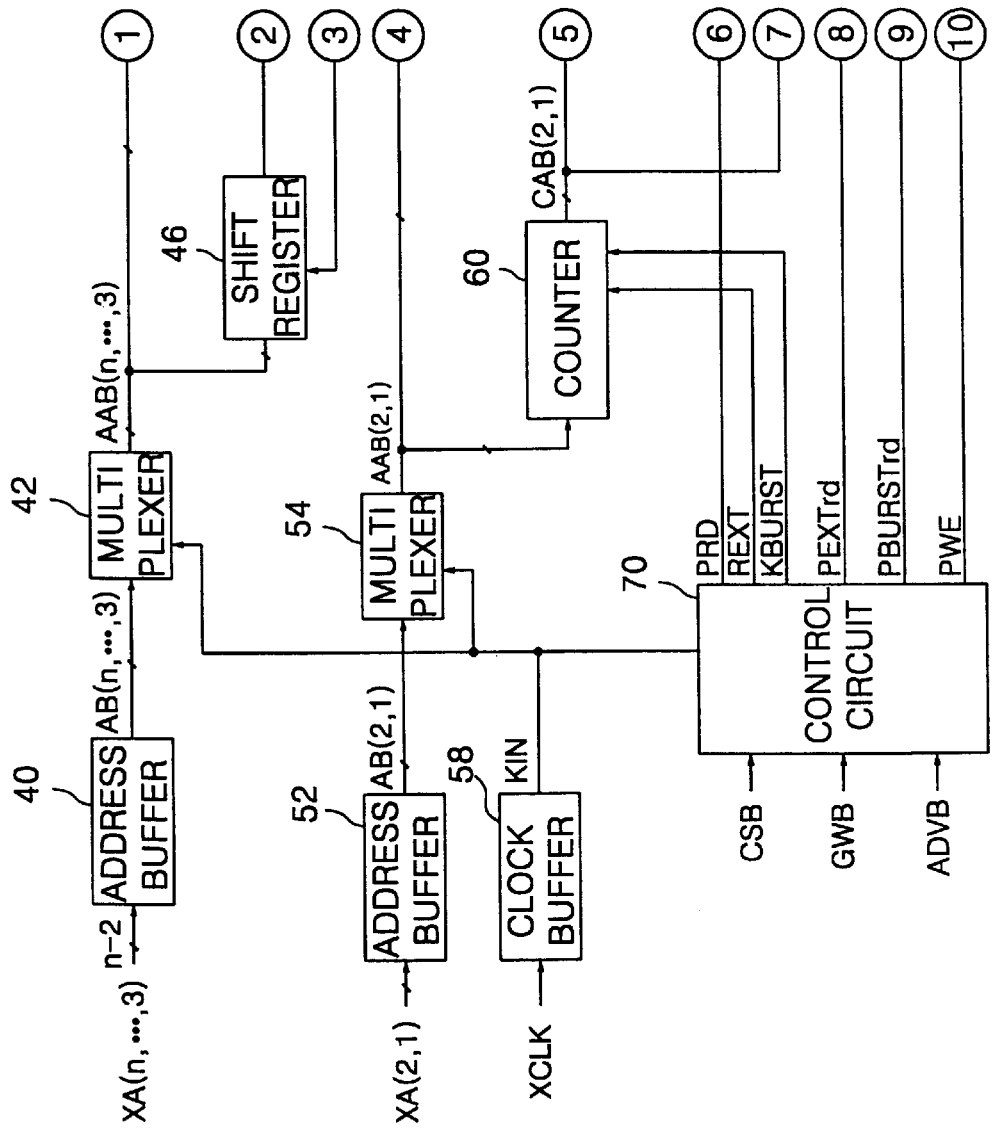
FIG. 4 is a block diagram illustrating an address generating circuit according to a first embodiment of the present invention.
Figure 4B:
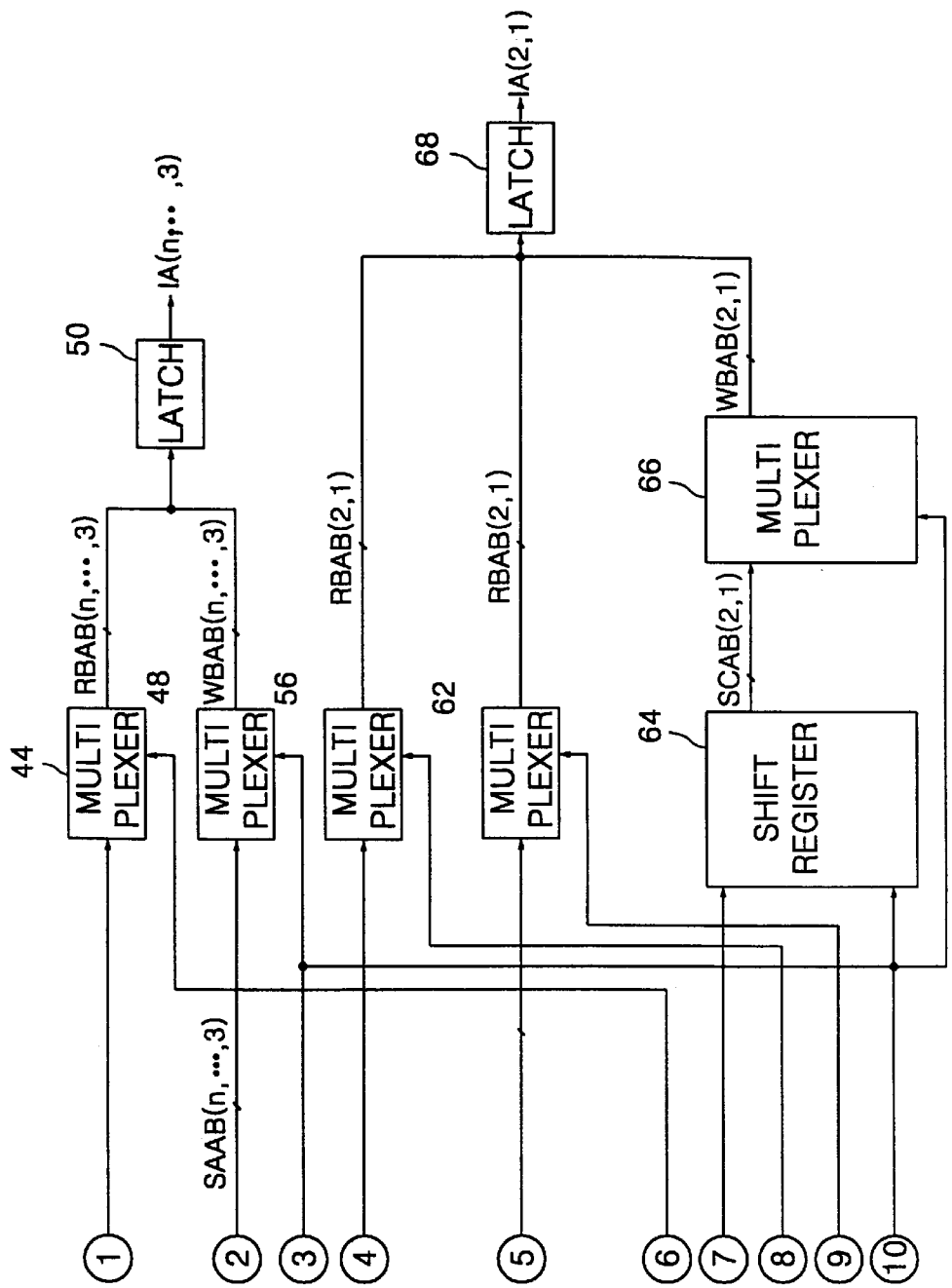

As shown in FIG. 4 illustrating the address generating circuit of the semiconductor memory device in accordance with a first embodiment of the present invention, the circuit comprises address buffers 40, 52, multiplexers 42, 44, 48, 56, 62, 66, shift registers 46, 64, clock buffer 58, latches 50, 68, and a control circuit 70. The structure as shown in FIG. 4 designates a read address generating circuit after 0 cycle and a write address generating circuit after n cycles.

The operations of the address generating circuit of the present invention as described in the above will be explained as follows.

The address buffers 40, 52 buffer the externally inputted addresses XA(n, . . . , 3), XA(2, 1), and generate the buffered address AB(n, . . . , 3), AB(2, 1), respectively. The multiplexers 42, 54 select and output the buffered address AB(n, . . . , 3), AB(2, 1) in response to the clock signal KIN. The control circuit 70 receives the inversion chip selective signal CSB, read/write control signal GWB, and normal/burst mode control signal ADVB, to generate the external input control signal KEXT, read input selective signal PEXTrd, burst read input selective signal PBURSTrd, burst continuing control signal KBURST, and read, write control signals PRD, PWE. The shift register 46 shifts the output signal AAB(n, . . . , 3) of the multiplexer 42 by n cycle in response to the control signal PWRITE to output it. The counter 60 outputs the output signal AAB(2, 1) of the multiplexer 54 as the signal CAB(2, 1) in response to the control signal KEXT, and outputs the signal counted from the burst starting address as the signal CAB(2, 1) in response to the burst continuing control signal KBURST.

The multiplexer 44 outputs the output signal AAB(n, . . . , 3) of the multiplexer 42 in response to the read control signal PRD. The multiplexer 48 outputs the output signal of the shift register 46 in response to the write control signal PWE. The latch 50 latches a signal outputted from one of the multiplexers 44, 48.

The multiplexer 56 receives the signal AA multiplexer B(2, 1) outputted from the multiplexer 54 in response to the read input selective signal PEXTrd. The multiplexer 62 outputs the burst address outputted from the counter 60 in response to the external burst read input selective signal PBURSTrd. The shift register 64 shifts and outputs the output signal of the counter 60 in response to the write control signal PWE. The multiplexer 66 outputs the output signal of the shift register 64 in response to the write control signal PWE. The latch 68 latches and outputs the signal outputted from the multiplexers 56, 62, 66. The output signals of the multiplexers 44, 48 are wired-ORed to be transmitted to the latch 50. Also, the output signals of the multiplexers 56, 62, 66 are wired-ORed to be transmitted to the latch 68.

Figure 5:
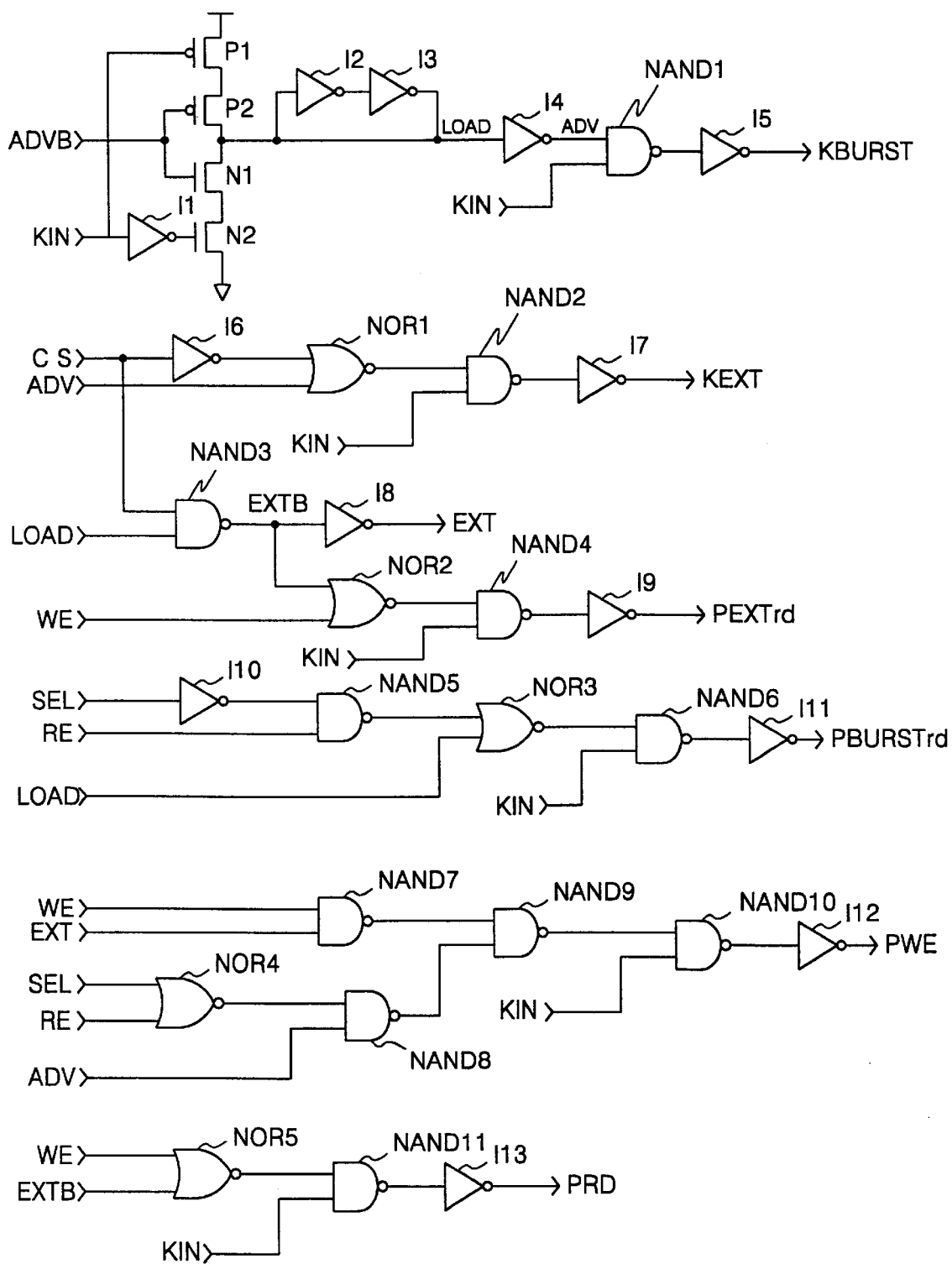
FIG. 5 is a circuit diagram for illustrating a control circuit as illustrated in FIG. 4.

FIG. 5 is a circuit diagram for illustrating the control circuit as shown in FIG. 4, the circuit comprises PMOS transistors P1, P2, NMOS transistors N1, N2, inverters I1–I13, NOR gates NOR1–5, and NAND gates NAND1–11.

The generation of the read and write addresses in a normal mode will be explained as follows.

In a normal mode, the burst mode control signal ADVB for generating a high bit address is shifted to a "low" level, and the inversion chip selective signal CSB is shifted to a "low" level. And, the PMOS transistor P2 is turned-on in response to the normal/burst mode control signal ADVB of low level, and the PMOS transistor P1 is turned-on in response to the clock signal KIN of "low" level to generate the signal LOAD of high "level". The inverters I2, I3 latch the signal LOAD to output it. The inverter I4 inverts the signal LOAD to generate the signal ADV of "low" level. The NAND gate NAND1 and inverter I5 generate the burst continuing control signal KBURST of "low" level in response to the signal ADV of "low" level. That is, the burst continuing signal KBURST in the normal mode is fixed as a "low" level.

The inverter I6 inverts the chip selective signal CS to generate a signal of "low" level. The NOR gate NOR1 generates a signal of "high" level in response to the output signal of the inverter I6 of "low" level and the signal ADV of "low" level. The NAND gate NAND2 and inverter I7 invert the clock signal in response to the clock signal KIN to generate the inverted signal as the external input control signal KEXT. The NAND gate NAND3 performs NANDing the chip selective signal CS of "high" level and the signal LOAD of "high" level thereby generating the signal EXTB of "low" level. The inverter I8 inverts the signal of "low" level to thereby generate the signal EXT of "high" level. The NOR gate NOR2 generates, in a write mode, a signal of "low" level in response to the write enable signal WE of "high" level, and in a read mode performs NORing the write enable signal WE of "low" level and the signal EXTB of "low" level to thereby generate a signal of "high" level. The NAND gate NAND4 and inverter I9 generate the signal PEXTrd of "low" level in response to the output signal of the NOR gate NOR2 of "low" level in a write mode, and generate the read input selective signal PEXTrd shifting in response to the clock signal KIN in a read mode.

The selective signal SEL is enabled to a "high" level when the chip selective signal CS of "high" level and the signal EXT of "high" level are generated (the generating circuit of the selective signal SEL is not shown). The NAND gate NAND5 generates, in a write mode, a signal of "high" level in response to the read enabled signal RE of "low" level and the output signal of the inverter I10 of "low" level which is inverted from a signal of "high" level, and generate in a read mode, a signal of "low" level in response to the read enabled signal RE of "high" level. The NOR gate NOR3 generates a signal of "low" level in response to the output signal of the NAND gate NAND5 of "high" level in a write mode, and generates a signal "low" level in response to the signal LOAD of "high" level in a read mode. The NAND gate NAND6 and inverter I11 receive a signal of "low" level in read and write modes and output the burst read input selective signal PBURSTrd of "low" level.

The NAND gate NAND7 performs, in a write mode, NANDing the write enabled signal WE of "high" level and the signal EXT of "high" level to thereby generate a signal of "low" level, and performs, in a read mode, NANDing the write enabled signal WE of "low" level and the signal EXT of "high" level to thereby generate a signal of "high" level. In a write mode, the NOR gate NOR4 performs NORing the selective signal SEL of "high" level and the enabled signal RE of "low" level to thereby generate a signal of "low" level, and in a read mode the NOR gate NOR4 performs NORing the selective signal SEL of "high" level and the read enabled signal RE of "high" level to thereby generate a signal of "low" level. The NAND gate NAND8 performs NANDing the output signal of the NOR gate NOR4 of "low" level and the signal ADV of "high" level to thereby a signal of "high" level in read and write modes. The NAND gate NAND9 performs NANDing the output signal of the NAND gate NAND7 of "low" level and the output signal of the NAND gate NAND8 of "high" level to thereby a signal of "high" level in a write mode, and performs NANDing the output signals of the NAND gates NAND7, 8 of "high" level to thereby a signal of "low" level in a read mode. The NAND gate NAND10 and inverter I12 generate the write control signal PWE in response to the clock signal KIN in a write mode, and generate the write control signal PWE of "low" level in a read mode.

The NOR gate NOR5 performs NORing the write enabled signal WE of "high" level and the signal EXTB of "low" level to thereby a signal of "low" level in a write mode, and performs NORing the write enable signal WE of "low" level and the signal EXTB of "low" level to thereby a signal of "high" level in a read mode. The NAND gate NAND 11 and the inverter I13 generate a signal of "low" level in a write mode, and generate the read control signal PRD in response to the clock signal KIN in a read mode.

Next, the generation of read and write addresses in a burst mode will be explained as follows.

The burst mode will be explained by being applied to the times when the burst starting address is input and when the burst continuing address is generated.

First, the operation will be explained as to when the burst starting address is input. During the input of the burst starting address, the normal/burst mode control signal ADVB is shifted to a "low" level, and the inversion chip selective CSB is shifted to a "low" level. Accordingly, the control signals at the time the burst starting read and write addresses are generated are the same control signals as those at the time the read and write addresses are generated in a normal mode.

In the generation of the burst continuing address, when the normal/burst mode control signal ADVB is shifted to a "high" level irrespective of the state of the inversion chip selective signal CSB and read/write control signal GWB, the NMOS transistor N1 is turned-on and the NMOS transistor N2 is turned-on, off to thereby generate the signal LOAD of "low" level. The inverter I4 inverts the signal LOAD to thereby generate a signal of "high" level. The NAND gate NAND1 and the inverter I5 generate the burst continuing control signal KBURST shifting in response to the clock signal KIN.

That is, the generation of the burst continuing address allows the signal LOAD to be shifted to a "low" level, and the signal ADV to be shifted to a "high" level.

The output signal of the NOR gate NOR1 is changed to a "low" level. The NAND gate NAND2 and the inverter I7 generate a signal of "low" level irrespective of the clock signal KIN. The NAND gate NAND3 generates the signal EXTB of "high" level in response to the signal LOAD of "low" level. The inverter I8 generates the signal EXT of a "low" level. The NOR gate NOR2 generates a signal of "low" level in response to the signal EXTB of "high" level. The NAND gate NAND4 and the inverter I9 generate the signal PEXTrd of "low" level irrespective of the clock signal KIN.

The selective signal SEL is at a "high" level when the burst starting address is generated, and at a "low" level when the burst continuing address is generated. Accordingly, the inverter I10 inverts the selective signal SEL of "low" level when the burst continuing address is generated to thereby generate a signal of "high" level. The NAND gate NAND5 performs NANDing the read enabled signal RE of "low" level and the output signal of the inverter I10 of "high" level to thereby generate a signal "high" level when a write mode is operated, and performs NANDing the read enabled signal RE of "high" level and the output signal of the inverter I10 of "high" level to thereby generate a signal of "low" level when a read mode is operated. The NOR gate NOR3 performs NORing the signal LOAD of "low" level and the output signal of the NAND gate NAND5 of "high" level to thereby generate a signal of "low" level when a write mode is operated, and performs NORing the signal ROAD of "low" level and the output signal of the NAND gate NAND5 of "low" level to thereby generate a signal "high" level when a read mode is operated. The NAND gate NAND6 and inverter I11 generate a signal of "low" level during a write mode, and generates the burst read input selective signal PBURSTrd shifting in response to the clock signal KIN during a read mode.

The NAND gate NAND7 performs NANDing the write enabled signal WE of "high" level and the signal EXT of "low" level to thereby generate a signal "high" level when a write mode is operated, and performs NANDing the write enabled signal WE of "low" level and the signal EXT of "low" level to thereby generate a signal of "high" level when a read mode is operated. The NOR gate NOR4 performs NORing the read enabled signal RE of "low" level and the selective signal SEL of "low" level to thereby generate a signal of "high" level when a write mode is operated, and performs NORing the read enabled signal RE of "high" level and the selective signal SEL of "low" level to thereby generate a signal "low" level when a read mode is operated. The NAND gate NAND8 performs NANDing the output signal of the NOR gate NOR4 of "high" level and the signal ADV of "high" level to thereby generate a signal "low" level when a write mode is operated, and performs NANDing the output signal of the NOR gate of "high" level and the signal ADV of "high" level to thereby generate a signal of "high" level when a read mode is operated. The NAND gate NAND9 performs NANDing the output signal of the NAND gate NAND7 of "high" level and the output signal of the NAND gate NAND8 of "low" level to thereby generate a signal "high" level when a write mode is operated, and performs NANDing the output signal of the NAND gate NAND7 of "high" level and the output signal of the NAND gate NAND8 of "high" level to thereby generate a signal of "low" level when a read mode is operated. The NAND gate NAND10 and the inverter I12 generate the write control signal PWE shifting in response to the clock signal KIN during the write mode, and generate a signal "low" level during the read mode.

The NOR gate NOR5 generates a signal of "low" level during the write mode and a signal of "high" level during the read mode. The NAND gate NAND11 and the inverter I13 generate a signal of "low" level during the write mode and the read control signal PRD in response to the clock signal KIN during the read mode, respectively.

That is, the control circuit 70 of the present invention serves to generate the external input signal KEXT, read control signal PRD and read input selective signal PEXTrd in response to the clock signal KIN during the read operation of the normal mode, and generates the external input signal KEXT and the write control signal PWE in response to the clock signal KIN during the write operation in a normal mode.

While a burst mode is operated, read and write control signals is generated as like in a normal mode when the burst starting address is input, the burst continuing control signal KBURST and write control signal PWE are generated when the burst continuing write address is generated, and the burst continuing control signal KBURST, read control signal PRD and burst read input selective signal PBURSTrd are generated when the burst continuing read address is generated.

Figure 6:
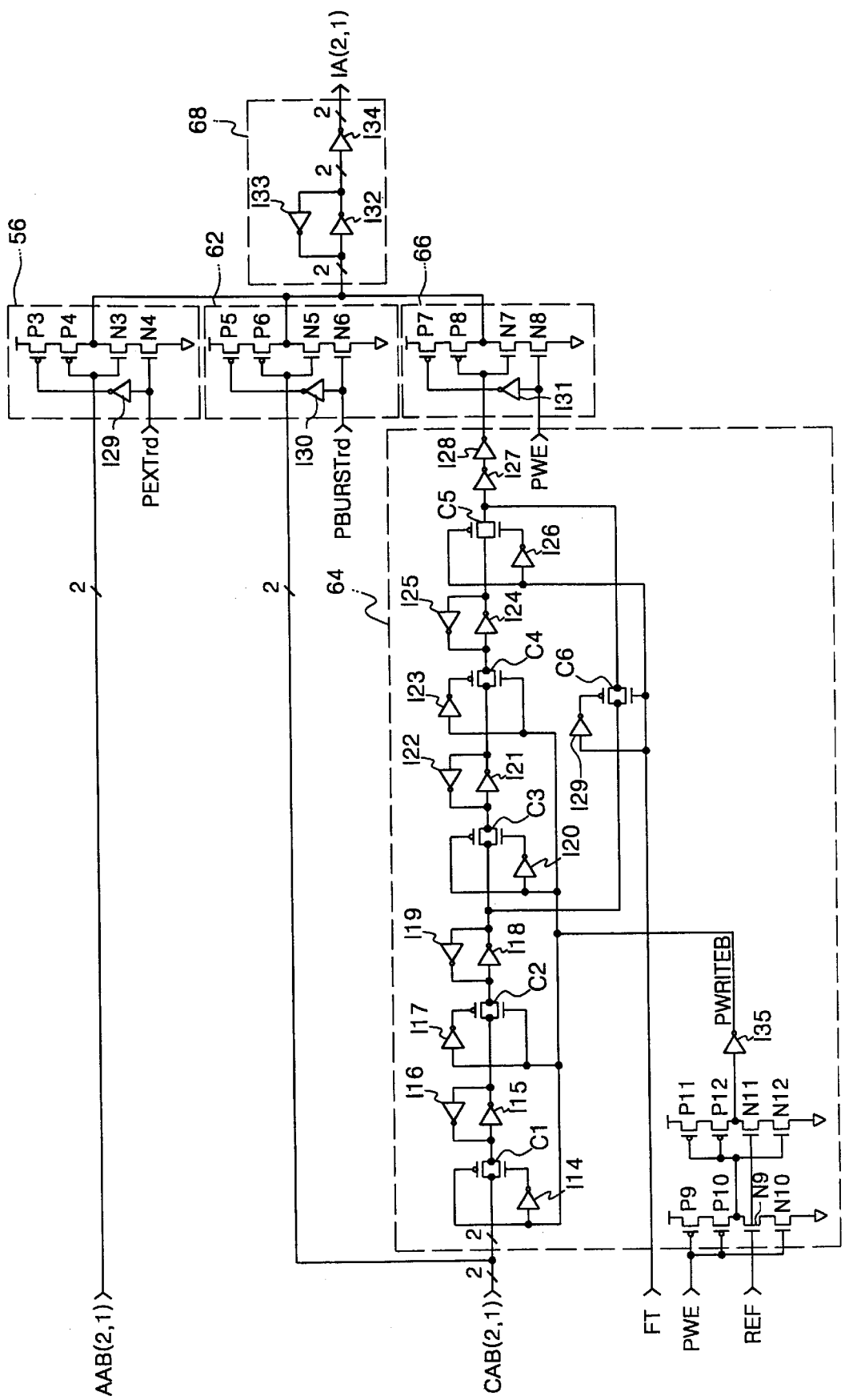
FIG. 6 is a circuit diagram of an embodiment of a shift register and multiplexers of FIG. 4.

FIG. 6 is a circuit diagram for illustrating the shift register as shown in FIG. 4, and the circuit includes inverters I14–I35, PMOS transistors P3–P12, NMOS transistors N3–N12 and CMOS transmission gates C1–C6.

The inverters I14–I28, 135, CMOS transmission gates C1–C6, PMOS transistors P9–12, and NMOS transistors N9–12 indicate the composition of the shift register 64 as shown in FIG. 5. The inverter I29, PMOS transistors P3, P4 and NMOS transistor N3, N4 indicate the composition of the multiplexer 56. The inverter I30, PMOS transistors P5, P6 and NMOS transistors N5, N6 indicate the composition of the multiplexer 62. The inverter I31, PMOS transistors P7, P8 and NMOS transistors N7, N8 indicate the composition of the multiplexer 66.

The operation of each block shown in FIG. 6 will be explained as follows.

The PMOS transistors P9, P10 are turned-on in response to the write control signal PWE of "low" level from the control circuit 70, and the NMOS transistor N12 is turned-on, thereby generating a signal of "low" level. The inverter I35 inverts a signal of "low" level to generate the signal PWRITEB of "high" level. The NMOS transistor N10 is turned-on in response to the write control signal PWE of "high" level, and PMOS transistors P11, P12 are turned-on, thereby generating a signal of "high" level. The inverter I35 inverts a signal of "high" level to generate the signal PWRITEB of "low" level. A control signal for controlling the shift register 64 is generated in such a method as described in the above.

The CMOS transmission gate C1 transmits the output signal CAB(2, 1) of the counter 60 in response to the signal PWRITEB of "low" level. The latch being composed of the inverters I15, I16 latches the output signal of the CMOS transmission gate C1. The CMOS transmission gate C2 transmits the latched signal to the latch composed of the inverters I15, I16 in response to the signal PWRITEB of "high" level. The latch composed of the inverters I18, I19 latches the output signal of the CMOS transmission gate C2. The CMOS transmission gate C3 transmits the latched signal to the latch composed of the inverters I18, I19 in response to the signal PWRITEB of "low" level. The latch composed of the inverters I22, I23 latches the output signal of the CMOS transmission gate C3. The CMOS transmission gate C4 transmits the latched signal to the latch composed of the inverters I22, I23 in response to the signal "high" level. The latch composed of the inverters I24, I25 latches the output signal of the CMOS transmission gate C4. The CMOS transmission gate C6 transmits the data latched by the inverters I18, I19 to the output terminal of the CMOS transmission gate C5 in response to the write control signal FT after 1 cycle and 2 cycles. The inverters I27, I28 performs buffering the output signal of the CMOS transmission gate C5.

The multiplexer 56 allows the PMOS transistor P3 and NMOS transistor N4 to be turned-on in response to the read input selective signal PEXTrd of "high" level, thereby inverting the output signal AAB(2, 1) of the multiplexer 54 to output it.

The multiplexer 62 allows the PMOS transistor P5 and NMOS transistor N6 to be turned-on in response to the burst read input selective signal PBURSTrd of "high" level, thereby inverting the output signal CAB(2, 1) of the counter 60 to output it.

The multiplexer 66 allows the PMOS transistor P7 and NMOS transistor N8 to be turned-on in response to the write control signal PWE of "high" level, thereby inverting the output signal of the shift register 64 to output it.

The inverter I34 and the latch composed of inverters I32, I33 latch the output signal of the multiplexers 56, 62, 66 to thereby output as an output signal IA(2, 1).

Figure 7A:
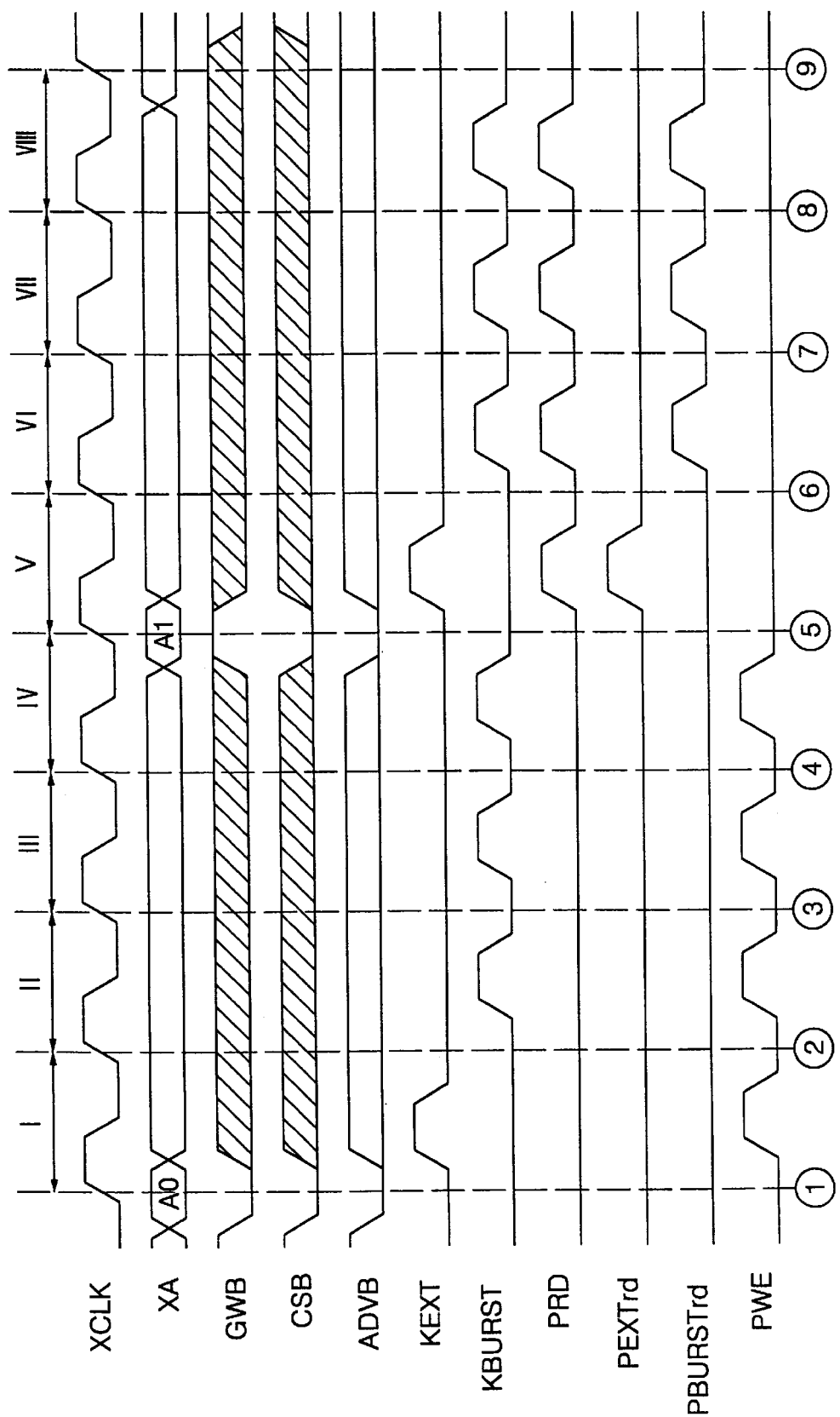
FIG. 7 is a timing diagram for illustrating an operation of the address generating circuit of FIG. 4 in a burst mode.
Figure 7B:
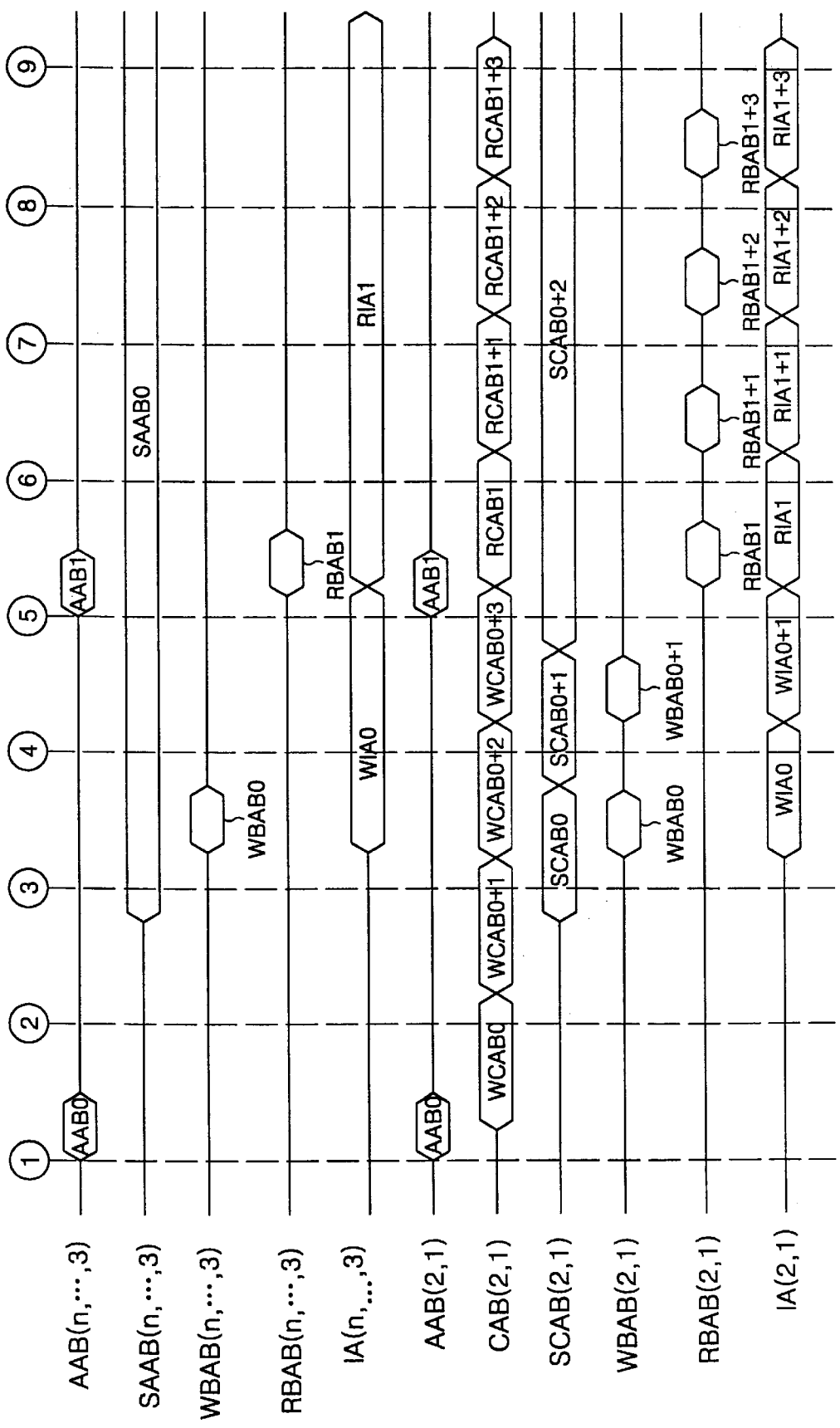

FIG. 7 is a timing diagram for illustrating the operation of the address generating circuit as shown in FIG. 4 in a burst mode. The range of the first cycle to the fourth cycle indicates the operation generating the burst write address. The fifth cycle to the eighth cycle indicates the operation generating the burst read address. In other words, the timing diagram illustrates the operation generating the read address after 0 cycle and the write address after 2 cycle.

The operation generating the burst address will be explained with reference to FIG. 7 as follows.

The generation of the control signals in the timing diagram as shown in FIG. 7 was described in the explanation to the control circuit 70 in the above. The operation of address generating circuit according to the present invention will be explained classified by cycle with reference to FIG. 7.

In the first cycle, when the normal/burst mode control signal ADVB is at a "high" level, the inversion chip selective signal CSB at a "low" level and the read/write control signal GWB at a "low" level, and then the external input control signal KEXT and the write control signal PWE become to be at a "high" level. The multiplexers 42, 54 output the buffered addresses AB(n, . . . , 3), AB(2, 1) in response to the buffered clock signal KIN, respectively. The counter 60 generates the output address AAB(2, 1) of the multiplexer 54 as the address CAB(2, 1) in response to the control signal KEXT. In the timing diagram of FIG. 7, the address is designated as the address WCABO. The second cycle II to the fourth cycle IV performs the operation generating the burst continuing write address. At this time, the burst continuing control signal KBURST and write control signal PWE which are generated from the control circuit 70 are shifted in response to the clock signal KIN, and the read control signal PRD, read input selective signal PEXTrd and burst read input selective signal PBURSTrd are fixed at a "low" level.

In the second cycle II, the counter 60 performs counting in response to the burst continuing control signal KBURST to generate the burst continuing address WCABO+1. The shift register 46 performs shifting by 2 cycles in response to the write control signal PWE to generate the address SAABO. The shift register 64 shifts the address WCABO by 2 cycles in response to the control signal PWE to generate the address SCABO.

In the third cycle III, the shift register 46 maintains the address SAABO, and the multiplexer 48 outputs the address WBABO in response to the write control signal PWE. The latch 50 outputs the output signal WBABO as an address WIAO. The counter 60 counts in response to the burst continuing control signal KBURST to generate the burst continuing address WCABO+2. The shift register 64 shifts the address WCABO+1 by 2 cycles in response to the write control signal PWE to output it as the address SCABO+1. The multiplexer 66 outputs the address WBABO in response to the write control signal PWE. The latch 68 outputs the output signal as the address WIAO.

In the fourth cycle IV, the latch 50 maintains the address WIAO latched in the prior cycle. The counter 60 performs counting in response to the control signal KBURST to generate the burst continuing address WCABO+3. The shift register 64 shifts the output address WCABO+2 of the counter 60 by 2 cycles in response to the write control signal PWE, thereby generating the address SCABO+2. The multiplexer 66 outputs the address WBABO+1 in response to the write control signal PWE. The latch 68 outputs the output signal of the multiplexer 66 as an address WIAO+1.

That is, n–2 bit of high level is fixed, and 2 bit of low level is varying and generated during the burst continuing mode.

The fifth cycle V to the eighth VIII in the drawing illustrates the operation in the burst read mode.

In the fifth V, the control circuit 70 generates the external input control signal KEXT of "high" level, read control signal PRD, external read input selective signal PEXTrd, and write control signal PWE and burst continuing control signal KBURST of "low" level. The address buffers 40, 52 perform buffering the burst starting read address XA(n, . . . , 2), XA(2, 1) from the external to thereby generate the buffered addresses AB(n, . . . , 3), AB(2, 1). The multiplexers 42, 54 output the buffered addresses AB(n, . . . , 3), AB(2, 1) in response to the buffered clock signal KIN, respectively. The multiplexer 44 outputs the output address AAB 1 of the multiplexer 42 as an address RBAB1 in response to the read control signal PRD, the multiplexer 56 outputs the output address AAB1 of the multiplexer 54 as an address RBAB1 in response to the read input selective signal PEXTrd. The latches 50, 68 latch the output address RBAB1 of the multiplexers 44, 56 thereby generating the burst read starting address RIA1. The counter 60 outputs the output address AAB1 of the multiplexer 54 as an address RCAB1 in response to the external input control signal KEXT.

The sixth cycle VI to the eighth cycle VIII performs the operation of generating the burst continuing read address. At this time, the control circuit 70 generates the shifting burst continuing control signal KBURST, read control signal PRD, and burst read selective signal PBURSTrd in response to the clock signal KIN. Thereafter, the control circuit 70 generates the external input control signal KEXT, external read input selective signal PEXTrd, and write control signal PWE.

In the sixth cycle VI, the latch 50 outputs the address RIA1 latched in the prior cycle. The counter 60 performs counting in response to the burst continuing control signal KBURST to generate the burst continuing address RCAB1+1. The multiplexer 62 is enabled by the burst read input selective signal PBURSTrd to thereafter output the output signal RCAB1+1 of the counter 60 as the address RBAB1+1. The latch 68 latches the output signal of the multiplexer 62 to output it as the address RIA1+1.

In the seventh cycle VII, the latch 50 outputs the latched address RIA1. The counter 60 performs counting in response to the burst continuing control signal KBURST to generate the burst continuing address RCAB1+2. The multiplexer 62 is enabled by the burst read input selective signal PBURSTrd and outputs the output signal RCAB1+2 of the counter 60 as the address RBAB1+2. The latch 68 latches the output signal of the multiplexer 62 and outputs it as the address RIA1+2.

In the eighth cycle VIII, the latch 50 outputs the latched address RIA1 as it is. The counter 60 counts in response to the burst continuing control signal KBURST to generates the burst continuing address RCAB1+3. The multiplexer 62 is enabled by the burst read input selective signal PBURSTrd to output the output signal RCAB1+3 of the counter 60 as the address RCAB1+3. The latch 68 latches the output signal of the multiplexer 62 to generate it as the address RIA1+3.

In the fourth cycle IV, when a write command is input, the addresses SCAB0+2, SCAB0+3 stored in the shift register 64 are output through the multiplexer 66, latch 68 in response to the write control signal PWE. Because of the reason, the generation of the write addresses WIAO+2, WIAO+3 is not shown in FIG. 7.

As shown in FIG. 7, the write address is delayed by 2 cycles to be generated, and the read address is generated after 0 cycle.

FIG. 8 is a timing diagram for illustrating an operation of the address generating circuit in a normal mode as shown in FIG. 4. In the normal mode, the chip selective signal CSB and normal/burst mode control signal is shifted to a "low" level.

The generation of the address in a normal mode will be explained as follows, with reference to FIG. 8.

The period of the first cycle I to the fourth cycle IV is for illustrating the generating operation of the write address.

The control circuit 70 generates the shifting external input control signal KEXT and write control signal PWE in response to the clock signal KIN.

In the first cycle, the multiplexer 42 outputs the address buffered by the address buffer 40 as the address AAB0 in response to the buffered clock signal KIN. The shift register 46 latches the output signal of the multiplexer 42 in response to the write control signal PWE. The multiplexer 54 outputs the address buffered by the address buffer 52 as the address AAB0 in response to the buffered clock signal KIN. The counter 60 outputs the address AAB0 as the address CAB0 in response to the external input control signal KEXT.

In the second cycle II, the multiplexer 42 outputs the address buffered by the address buffer 40 as the address AAB1 in response to the buffered clock signal KIN. The shift register 46 latches the address AAB1 and outputs the latched address AAB0 as the address SAAB0 in response to the write control signal PWE. The multiplexer 54 outputs the address buffered by the address buffer 52 as the address AAB1 in response to the buffered clock signal KIN. The counter 60 outputs the output signal of the multiplexer 54 as the address CAB1 in response to the external input control signal KEXT. The shift register 64 latches the address CAB1 in response to the write control signal PWE and outputs the address latched in the prior cycle as the address SCAB0.

In the third cycle III, the multiplexer 42 outputs the address buffered by the address buffer 40 as the address AAB2. The multiplexer 54 generates the address buffered the address buffer 40 as the address AAB2. The shift register 46 latches the address AAB2 outputted from the multiplexer 42 and outputs the latched address SAAB1 in the prior cycle. The multiplexer 48 outputs the output signal SAAB0 of the shift register 46 as the address WBAB0 in response to the write control signal PWE. The counter 60 outputs the output signal AAB2 of the multiplexer 54 as the address CAB2 in response to the external input control signal KEXT. The shift register 64 latches the address CAB2 and outputs the address CAB1 latched in the prior cycle as the address SCAB1. The multiplexer 66 generates the output signal SCAB0 of the shift register 64 as the address WBAB0 in response to the write control signal PWE. The latches 50, 68 outputs the output signal of the multiplexers 48, 66 as the address WIA0.

In the fourth cycle IV, the multiplexer 42 outputs the address buffered by the address buffer 40 as the address AAB3. The multiplexer 54 generates the address buffered the address buffer 52 as the address AAB3. The shift register 46 latches the address AAB3 outputted from the multiplexer 42 and outputs the latched address SAAB1 in the prior cycle as it is. The multiplexer 48 outputs the output signal SAAB1 of the shift register 46 as the address WBAB1 in response to the write control signal PWE. The counter 60 outputs the output signal AAB3 of the multiplexer 54 as the address CAB3 in response to the external input control signal KEXT. The shift register 64 latches the address CAB3 and outputs the address CAB2 latched in the prior cycle as the address SCAB2. The multiplexer 66 generates the output signal SCAB1 of the shift register 64 as the address WBAB1 in response to the write control signal PWE. The latches 50, 68 outputs the output signal of the multiplexers 48, 66 as the address WIA1. And, the address CAB2, CAB3 latched by the shift register 46, 64 are output in response to the write control signal PWE in the next cycle.

The cycles in the period of the fifth cycle to the eighth cycle are same in the operation. The control circuit 70 generates the shifting external input control signal KEXT, read control signal PRD, and external read input control signal PEXTrd in response to the clock signal KIN.

In the fifth cycle V, the mutilexer 44 outputs the address AAB4 outputted from the mutilplexer 42 as the address RBAB4 in response to the control signal PRD. The latch 50 latches the address RBAB4 to output it as the address RIA4. And, the multiplexer 56 outputs the address AAB4 outputted from the multiplexer 54 as the address RBAB4 in response to the read input selective signal PEXTrd. The latch 68 latches the address RBAB4 to output it as the address RIA4.

Each of the sixth cycle VI to the eighth cycle VII performs the same operation as in the fifth cycle V to generate the read addresses RIA5, RIA6, and RIA7, respectively.

As explained in the above, the write address after 2 cycles is generated in the burst write operation, and the read address after 0 cycle is generated in the burst read operation.

Figure 9A:
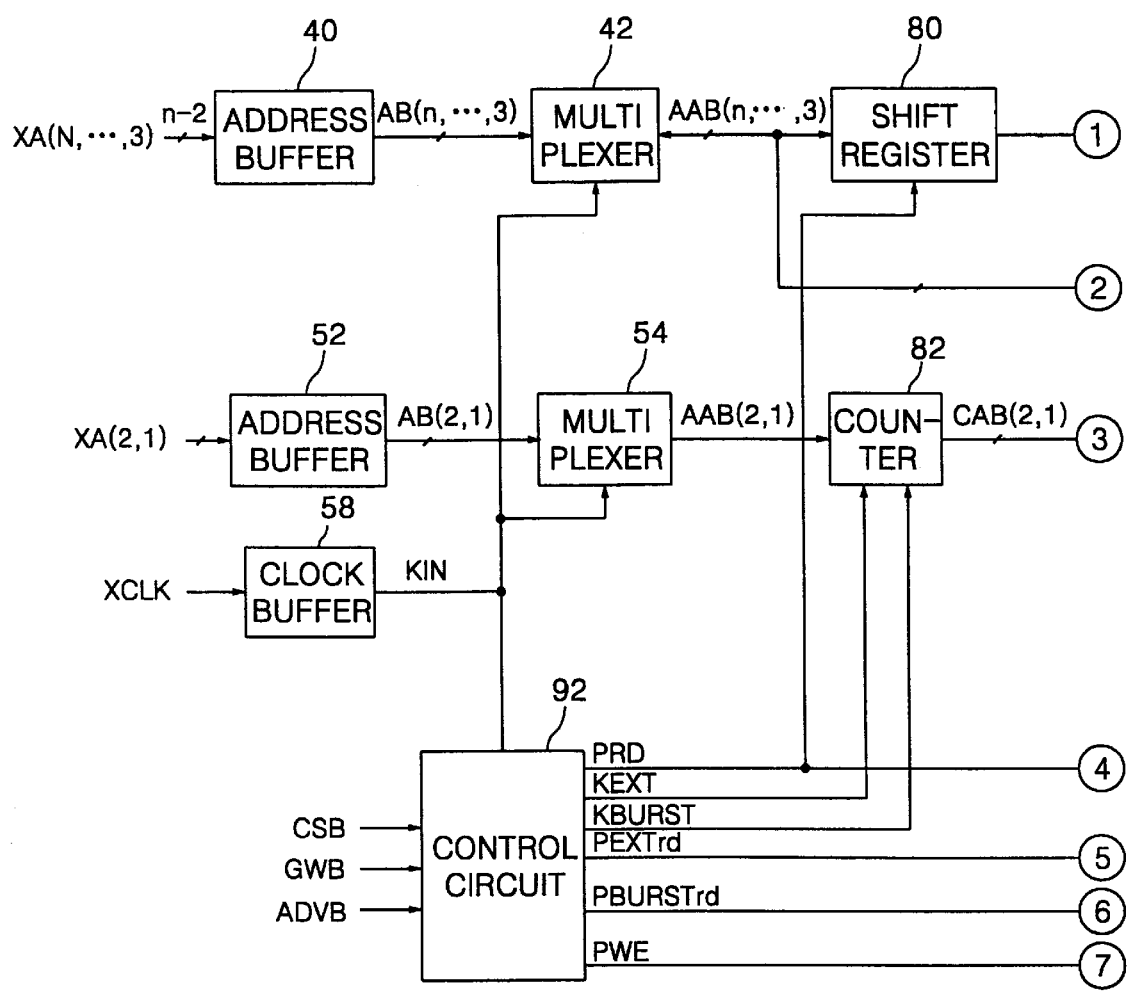
FIG. 9 is a block diagram for illustrating an address generating circuit of a semiconductor memory device according to a second embodiment of the present invention.
Figure 9B:
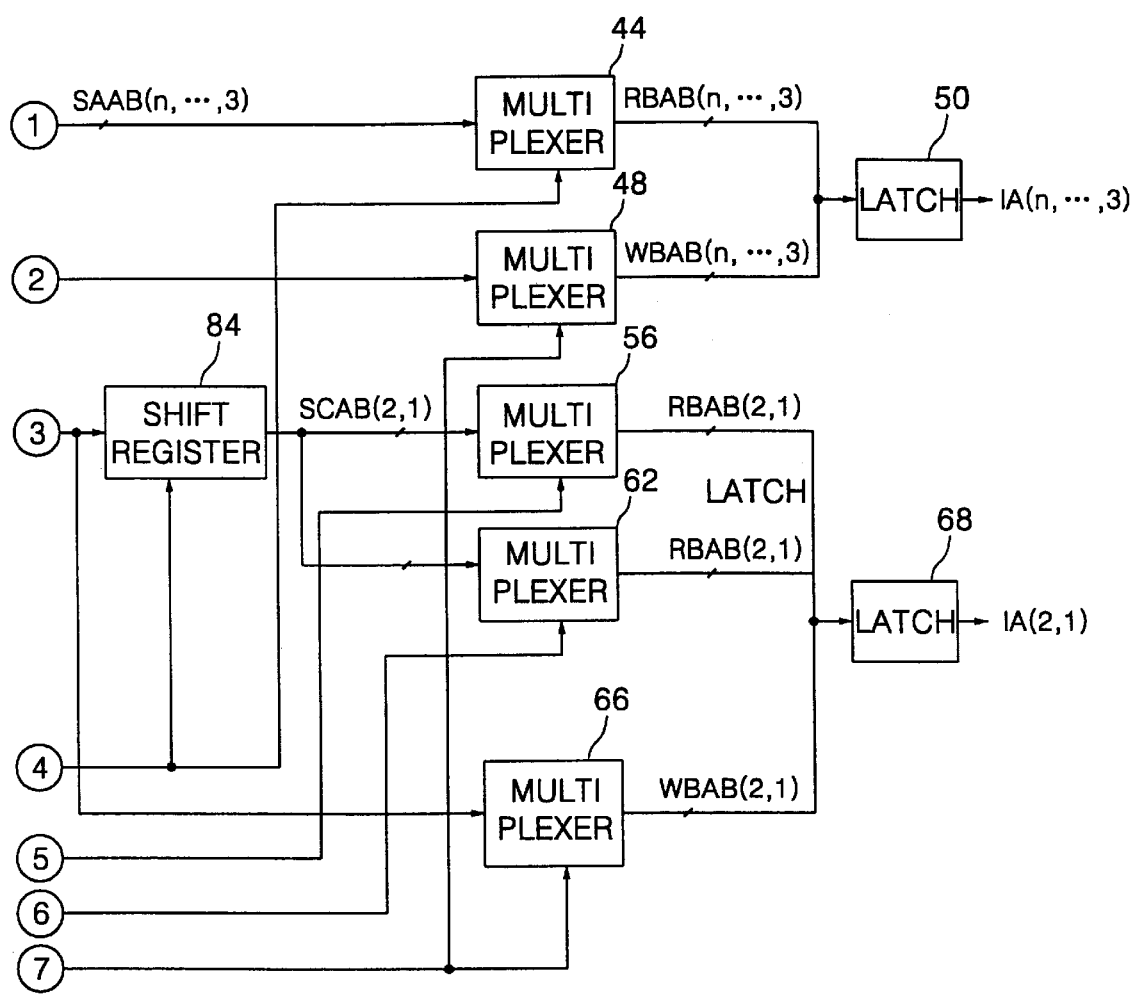

FIG. 9 is a block diagram illustrating an address generating circuit according to a second embodiment of the present invention. The circuit is constructed in such that the shift register 46 and counter 60 are removed, the shift register 80 is added between the multiplexers 42, 44, and the counter 82 and the shift register 82 are added between the multiplexers 42, 44, compared with the address generating circuit shown in FIG. 4. Although the added shift registers 80, 84 and the counter 82 are respectively identical to the register 46 and counter 60 shown in FIG. 4 in their structure, their reference numerals are indicated as being different from those of the register 46, counter 60 because their mounted positions and relative interconnections are different.

That is, FIG. 9 shows the structure for generating a write address after 0 cycle and a read address after n cycle.

In FIG. 9, the route generating read and write addresses in normal and burst modes will be explained as follows.

In a read address generating route in a normal mode, a high n−2 bit address is generated through the address buffer 40, multiplexer 42, shift register 80, multiplexer 44 and latch 50, and a low 2 bit address is generated through the address buffer 52, multiplexer 54, counter 82, shift register 84, multiplexer 56 and latch 68.

In a write address generating route in a normal mode, a high n'2 bit address is generated through the address buffer 40, multiplexer 42, multiplexer 48 and latch 50, and a low 2 bit address is generated through the address buffer 52, multiplexer 54, counter 82, shift register 84, multiplexer 62 and latch 68.

In a read address generating route in a burst mode, a high n−2 bit address is latched and generated through the address buffer 40, multiplexer 42, shift register 80, multiplexer 44 and latch 50. Also, a burst starting address of 2 bit of low level is generated through the address buffer 52, multiplexer 54, counter 82, shift register 84, multiplexer 56 and latch 68, and a low 2 bit burst continuing address is generated through the counter 82, shift register 84, multiplexer 62, and latch 68.

In a write address generating route in a burst mode, a high n−2 bit burst starting address is latched and generated through the address buffer 40, multiplexer 42, multiplexer 48 and latch 50. Also, a burst starting address of 2 bit of low level is generated through the address buffer 52, multiplexer 54, counter 82, multiplexer 66 and latch 68, and a burst continuing address is generated through the counter 82, multiplexer 66 and latch 68.

Figure 10A:
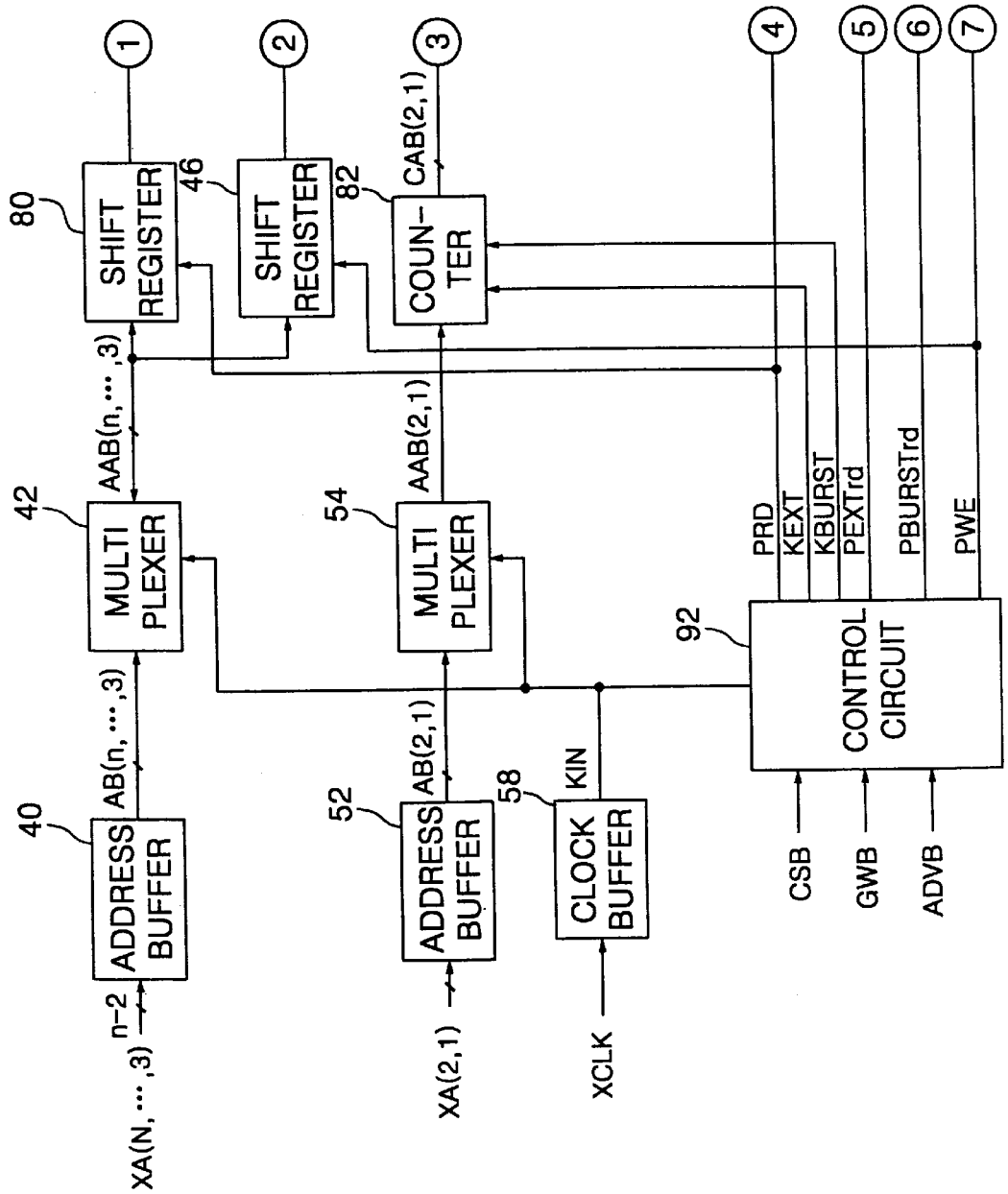
FIG. 10 is a block diagram for illustrating an address generating circuit of a semiconductor memory device according a third embodiment of the present invention.
Figure 10:
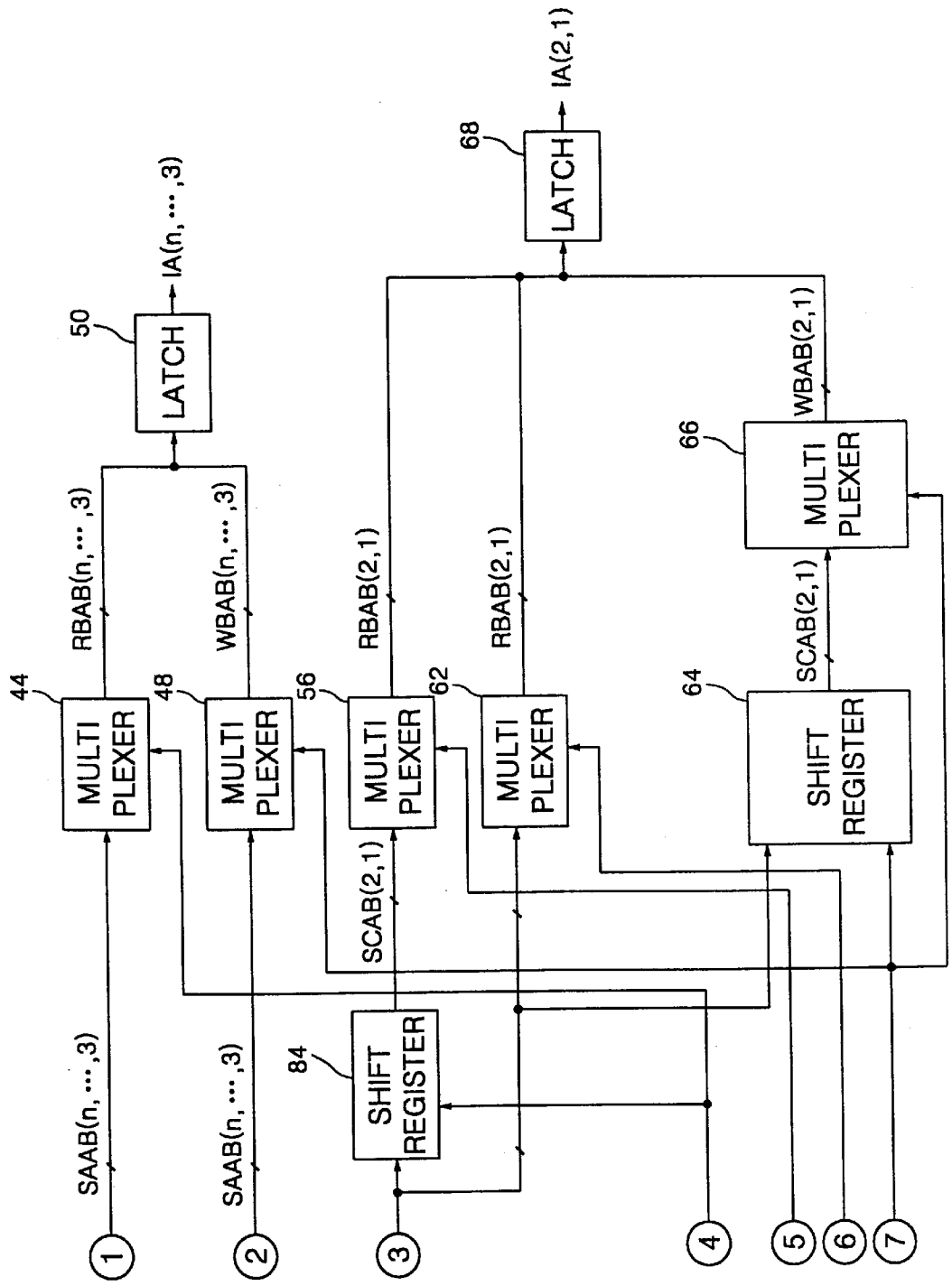

FIG. 10 is a block diagram illustrating an address generating circuit according to a third embodiment of the present invention. The circuit is constructed in such that the shift register 80 is added between the multiplexers 42, 44, the counter 82 and the shift register 84 are added between the multiplexers 54, 56, and the counter 60 is removed, compared with the address generating circuit shown in FIG. 4.

That is, FIG. 10 shows the structure for generating a write address after n cycle and a read address after n cycle.

In FIG. 10, the route generating read and write addresses in normal and burst modes will be explained as follows.

In a read address generating route in a normal mode, a high n−2 bit address is generated through the address buffer 40, multiplexer 42, shift register 80, multiplexer 44 and latch 50. Also, a low 2 bit address is generated through the address buffer 52, multiplexer 54, counter 82, shift register 84, multiplexer 56 and latch 68.

In a write address generating route in a normal mode, a high n−2 bit address is generated through the address buffer 40, multiplexer 42, shift register 46, multiplexer 48 and latch 50, and a low 2 bit address is generated through the address buffer 52, multiplexer 54, counter 82, shift register 64, multiplexer 66 and latch 68.

In a read address generating route in a burst mode, a high n−2 bit address is latched and generated through the address buffer 40, multiplexer 42, shift register 80, multiplexer 44 and latch 50. Also, a burst starting address of 2 bit of low level is generated through the address buffer 52, multiplexer 54, counter 82, shift register 84, multiplexer 56 and latch 68, and a low 2 bit burst continuing address is generated through the counter 82, multiplexer 62, and latch 68.

In a write address generating route in a burst mode, a burst starting address is latched and generated through the address buffer 40, multiplexer 42, shift register 46, multiplexer 48 and latch 50. Also, a burst starting address is generated through the address buffer 52, multiplexer 54, counter 82, shift register 64, multiplexer 66 and latch 68, and a burst continuing address is generated through the counter 82, shift register 64, multiplexer 66 and latch 68.

That is, the address generating circuit is constructed in such that the write address generating route and the read address generating route are different, thereby the circuit of the current invention can be easily applied to a semiconductor memory device which performs read, write operations after different cycles.

What is claimed is:

1. An address generating circuit of a semiconductor memory device comprising:

a first multiplexer for generating high level bits in response to an external address that is one of a read address and a write address;

a read address high data path and a write address high data path for transferring bits generated by the first multiplexer, the high data paths distinct from each other at least in part;

a first differential delay for delaying bits transferred through the read address high data path differentially from bits transferred through the write address high data path; and a control circuit for routing the generated high level bits that correspond to a read address through the read address high data path, and for routing the generated high level bits that correspond to a write address through the write address high data path.

2. The circuit of claim 1, further comprising a first latch for receiving and latching bits transferred by both high data paths.

3. The circuit of claim 1, wherein the first differential delay is a single shift register interposed within only one of the high data paths.

4. The circuit of claim 1, further comprising a first and second intermediate multiplexers coupled respectively between the read address high data path and the write address high data path, the intermediate multiplexers being responsive to the control circuit for routing the bits.

5. The circuit of claim 1, further comprising:
a second multiplexer for generating low level bits in response to the external address;
first, second and third low data paths for transferring bits generated by the second multiplexer, the low data paths distinct from each other at least in part, bits of an address corresponding to a normal operation being transferred through the first low data path;
a second differential delay for delaying bits transferred through the second low data path differentially from bits transferred through the third low data path; and
a counter interposed within at least the second and third low data paths for generating low level burst bits,
wherein the generated low level burst bits that correspond to a read address are routed through the second low data path, and the generated low level burst bits that correspond to a write address are routed through the third low data path.

6. The circuit of claim 5, further comprising a second latch for receiving and latching the bits transferred by the three low data paths.

7. An address generating circuit of a semiconductor memory device comprising:
a high bit read address generating means for generating a read address of a bit of high level;
a high bit write address generating means for generating a write address of a high bit delayed by a first predetermined cycle;
a low bit read address generating means for generating a read address in normal and burst modes of a low bit;
a low bit write address generating means for generating a write address in normal and burst modes of low bit delayed by a second predetermined cycle; and
a control means for controlling the high bit read address generating means, the high bit write address generating means, the low bit read address generating means, and the high bit write address generating means.

8. The circuit of claim 7, wherein the control means generates:
a write control signal in a write command cycle and a read control signal in a read command cycle in response to a chip control signal, read/write control signals, normal/burst mode control signals and a clock signal which are inputted from the external;
an external input control signal every cycle in a normal mode;
a read input selective signal resulting from delaying the external input control signal when read command is performed in a normal mode;
the external input control signal when a burst starting address is generated in a burst mode;
a burst continuing control signal when a burst continuing address is generated; and
a read input selective signal and a burst read input selective signal resulting from delaying the external input control signal and the burst continuing control signal when read command is performed in a burst mode.

9. The circuit of claim 7, wherein the high bit read address generating means comprises:
a first multiplexer for generating the high bit address in response to a clock signal; and
a second multiplexer for generating the output signal of the first multiplexer in response to a the read control signal.

10. The circuit of claim 7, wherein the low bit write address generating means comprises:
a first shift register for shifting the output signal of the first multiplexer by the second predetermined cycle in response to the write control signal; and
a third multiplexer for generating the output signal of the first shift register in response to the write control signal.

11. The circuit of claim 7, wherein the high bit read and write address generating means further comprises a first latch for latching a output signal of one of the first and the third multiplexers.

12. The circuit of claim 7, wherein the low bit read address generating means comprises:
a fourth multiplexer for outputting the low bit address in response to a clock signal;
a counter for outputting the output signal of the fourth multiplexer in response to an external input control signal in a normal mode, outputting the output signal of the fourth multiplexer as a burst starting address in response to the external input control signal in a burst mode, generating a burst continuing address in response to a burst continuing control signal;
a fifth multiplexer for generating the output signal of the fourth multiplexer in response to a read input selective signal; and
a sixth multiplexer for generating the output signal of the counter in response to a burst input selective signal.

13. The circuit of claim 12, wherein the low bit write address generating means comprises:
a second shift register for shifting the output signal of the counter by the second predetermined cycle in response to the write control signal; and
a seventh multiplexer for generating the output signal of the second shift register in response to the write control signal.

14. The circuit of claim 13, wherein the low bit read and write address generating means further comprise a second latch for latching the output signal of one of the fifth, sixth, and seventh multiplexers.

15. An address generating circuit of a semiconductor memory device comprising:
a high bit read address generating means for generating a read address of a high bit delayed by a first predetermined cycle;
a high bit write address generating means for generating a write address of a high bit;
a low bit read address generating means for generating a read address in normal and burst modes of a low bit delayed by a second predetermined cycle;
a low bit write address generating means for generating a write address in normal and burst modes of low bit; and
a control means for controlling the high bit read address generating means, the high bit write address generating means, the low bit read address generating means, and the high bit write address generating means.

16. The circuit of claim 15, wherein the control means generates:

a write control signal in a write command cycle and a read control signal in a read command cycle in response to a chip control signal, read/write control signals, normal/burst mode control signals and a clock signal which are inputted externally, an external input control signal every cycle in a normal mode;

a read input selective signal resulting from delaying the external input control signal when read command is performed in a normal mode;

the external input control signal when a burst starting address is generated in a burst mode;

a burst continuing control signal when a burst continuing address is generated; and a read input selective signal and a burst read input selective signal resulting from delaying the external input control signal and the burst continuing control signal when read command is performed in a burst mode.

17. The circuit of claim 15, wherein the high bit read address generating means comprises:

a first multiplexer for generating the high bit address in response to the clock signal;

a first shift register for shifting the output signal of the first multiplexer by a the first predetermined cycle in response to the read control signal; and a second multiplexer for generating the output signal of the first shift register in response to the read control signal.

18. The circuit of claim 17, wherein the high bit read and write address generating means further comprises a first latch for latching the output signal of the first multiplexer.

19. The circuit of claim 15, wherein the high bit write address generating means comprises a third multiplexer for generating the output signal of the first multiplexer in response to the write control signal.

20. The circuit of claim 15, wherein the low bit read address generating means comprises:

a fourth multiplexer for outputting the low bit address in response to a clock signal;

a counter for outputting the output signal of the fourth multiplexer in response to an external input control signal, and counting in response to a burst continuing control signal to generate a burst continuing address;

a second shift register for shifting an output signal of a counter by the second predetermined cycle in response to a read control signal;

a fifth multiplexer for generating the output signal of the second shift register in response to a read input selective signal; and a sixth multiplexer for generating the output signal of the second shift register in response to a burst input selective signal.

21. The circuit of claim 20, wherein the low bit read address generating means further comprises a second latch for latching the output signal of one of the fifth and sixth multiplexers.

22. The circuit of claim 15, wherein the low bit write address generating means comprises:

a seventh multiplexer for generating the output signal of the counter in response to the write control signal.

23. An address generating circuit of a semiconductor memory device comprising:

a high bit read address generating means for generating a read address of a high-level bit delayed by a first predetermined cycle;

a high bit write address generating means for generating a write address of a high bit delayed by a second predetermined cycle;

a low bit read address generating means for generating normal/burst read addresses of low bit delayed by a third predetermined cycle;

a low bit write address generating means for generating normal/burst write addresses of low bit delayed by a fourth predetermined cycle; and a control means for controlling the high bit read address generating means, the high bit write address generating means, the low bit read address generating means, and the high bit write address generating means.

24. The circuit of claim 23, wherein the control means generates:

a write control signal in a write command cycle and a read control signal in a read command cycle in response to a chip control signal, read/write control signals, normal/burst mode control signals and a clock signal which are inputted from the external;

an external input control signal every cycle in a normal mode;

a read input selective signal resulting from delaying the external input control signal when read command is performed in a normal mode;

the external input control signal when a burst starting address is generated in a burst mode;

a burst continuing control signal when a burst continuing address is generated; and a read input selective signal and a burst read input selective signal resulting from delaying the external input control signal and the burst continuing control signal when read command is performed in a burst mode.

25. The circuit of claim 23, wherein the high bit read address generating means comprises:

a first multiplexer for generating the high bit address in response to a clock signal;

a first shift register for shifting an output signal of the first multiplexer in response to a read control signal; and a second multiplexer for generating an output signal of the first shift register in response to the read control signal.

26. The circuit of claim 25, wherein the high bit write address generating means comprises:

a second shift register for shifting the output signal of the first multiplexer by the second predetermined cycle in response to a write control signal; and a third multiplexer for generating the output signal of the second shift register in response to the write control signal.

27. The circuit of claim 25, wherein the high bit read address generating means further comprises a first latch for latching the output signal of the second multiplexer.

28. The circuit of claim 23, wherein the low bit read address generating means comprises:

a fourth multiplexer for outputting the low bit read address in response to a clock signal;

a counter for outputting an output signal of the fourth multiplexer in response to an external input control signal, and generating a burst continuing address in response to a burst continuing control signal;

a third shift register for shifting an output signal of the counter by the third predetermined cycle in response to a read control signal;

a fifth multiplexer for generating an output signal of the third shift register in response to a read input selective signal; and a sixth multiplexer for generating the output signal of the counter in response to a burst read input selective signal.

29. The circuit of claim 28, wherein the low bit read address generating means further comprises a second latch for latching the output signal of one of the fifth and sixth multiplexers.

30. The circuit of claim 23, wherein the low bit write address generating means comprises:

a fourth shift register for shifting an output signal of a counter by the fourth predetermined cycle in response to a write control signal; and a seventh multiplexer for generating an output signal of the fourth shift register in response to the write control signal.

* * * * *

UNITED STATES PATENT AND TRADEMARK OFFICE
CERTIFICATE OF CORRECTION

PATENT NO. : 6,205,081 B1
DATED : March 20, 2001
INVENTOR(S) : Lee

It is certified that error appears in the above-identified patent and that said Letters Patent is hereby corrected as shown below:

<u>Title page,</u>
Item [73], Assignee, "Sumsung" should read -- Samsung --.

<u>Column 5,</u>
Line 39, "filler" should read -- fuller --.

<u>Column 8,</u>
Line 16, "inverter 19" should read -- inverter I9 --.
Line 27, "inverter 110" should read -- inverter I10 --.

<u>Column 10,</u>
Line 63, "135" should read -- I35 --.

<u>Column 14,</u>
Line 21, "AABO" should read -- AAB0 --.
Line 21, "SAABO" should read -- SAAB0 --.
Line 29, "SCABO" should read -- SCAB0 --.
Line 36, "SAABO" should read -- SAAB0 --.
Line 37, "WBABO" should read -- WBAB0 --.

<u>Column 15,</u>
Line 46: "n'2" should read -- n-2 --.

<u>Column 18,</u>
Line 7, "to a the read" should read -- to a read --.

<u>Column 19,</u>
Line 30, "by a the" should read -- by the --.
Line 19, "to the write" should read -- to a write --.

Signed and Sealed this

Twenty-first Day of January, 2003

JAMES E. ROGAN
*Director of the United States Patent and Trademark Office*